United States Patent
Kishi et al.

(10) Patent No.: US 9,831,337 B2
(45) Date of Patent: Nov. 28, 2017

(54) SEMICONDUCTOR DEVICE

(71) Applicant: SHINDENGEN ELECTRIC MANUFACTURING CO., LTD., Tokyo (JP)

(72) Inventors: Masato Kishi, Saitama (JP); Yuji Watanabe, Saitama (JP); Toshiyuki Takemori, Saitama (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 0 days.

(21) Appl. No.: 15/514,630

(22) PCT Filed: Feb. 20, 2015

(86) PCT No.: PCT/JP2015/054880
§ 371 (c)(1),
(2) Date: Mar. 27, 2017

(87) PCT Pub. No.: WO2016/132552
PCT Pub. Date: Aug. 25, 2016

(65) Prior Publication Data
US 2017/0229574 A1    Aug. 10, 2017

(51) Int. Cl.
*H01L 29/76* (2006.01)
*H01L 29/94* (2006.01)
(Continued)

(52) U.S. Cl.
CPC ...... *H01L 29/7813* (2013.01); *H01L 29/0692* (2013.01); *H01L 29/1095* (2013.01);
(Continued)

(58) Field of Classification Search
CPC ........... H01L 29/7811; H01L 296/7813; H01L 29/4236
(Continued)

(56) References Cited

U.S. PATENT DOCUMENTS 5,998,833 A    12/1999 Baliga
8,541,834 B2    9/2013 Nozu
(Continued)

FOREIGN PATENT DOCUMENTS

JP    4790908 B2    10/2011
JP    2012-204395 A    10/2012
(Continued)

OTHER PUBLICATIONS

International Search Report in PCT Application No. PCT/JP2015/054880, dated Mar. 17, 2015.
(Continued)

*Primary Examiner* — David S Blum
(74) *Attorney, Agent, or Firm* — Hauptman Ham, LLP

(57) ABSTRACT

A semiconductor apparatus includes: a gate electrode in a trench and facing a p type base region with a gate insulating film interposed therebetween on a portion of a side wall; a shield electrode in the trench and between the gate electrode and a bottom of the trench; an electric insulating region in the trench, the electric insulating region extending between the gate electrode and the shield electrode, and further extending along the side wall and the bottom of the trench to separate the shield electrode from the side wall and the bottom; a source electrode electrically connected to an $n^+$ type source region and the shield electrode. The shield electrode has high resistance regions at positions where the high resistance regions face the side walls of the trench, and a low resistance region at a position where the low resistance region is sandwiched between the high resistance regions.

9 Claims, 18 Drawing Sheets

(51) Int. Cl.

| | | |
|---|---|---|
| *H01L 31/062* | (2012.01) | |
| *H01L 31/113* | (2006.01) | |
| *H01L 31/119* | (2006.01) | |
| *H01L 29/78* | (2006.01) | |
| *H01L 29/10* | (2006.01) | |
| *H01L 29/423* | (2006.01) | |
| *H01L 29/06* | (2006.01) | |
| *H01L 29/40* | (2006.01) | |
| *H01L 29/417* | (2006.01) | |
| *H01L 29/36* | (2006.01) | |
| *H01L 29/66* | (2006.01) | |

(52) U.S. Cl.
CPC ............ *H01L 29/36* (2013.01); *H01L 29/407* (2013.01); *H01L 29/41741* (2013.01); *H01L 29/4236* (2013.01); *H01L 29/66712* (2013.01)

(58) Field of Classification Search
USPC ........................................................ 257/330
See application file for complete search history.

(56) References Cited

U.S. PATENT DOCUMENTS

| | | |
|---|---|---|
| 8,643,095 B2 | 2/2014 | Suzuki et al. |
| 8,723,253 B2 | 5/2014 | Ohta et al. |
| 2013/0069150 A1 | 3/2013 | Matsuoka et al. |
| 2015/0214362 A1* | 7/2015 | Oh ...................... H01L 29/7827 257/330 |
| 2017/0222023 A1* | 8/2017 | Su ..................... H01L 29/66734 438/270 |
| 2017/0222037 A1* | 8/2017 | Kishi .................. H01L 29/7811 257/330 |
| 2017/0229574 A1 | 8/2017 | Kishi et al. |

FOREIGN PATENT DOCUMENTS

| | | |
|---|---|---|
| JP | 2012-204529 A | 10/2012 |
| JP | 2012-204636 A | 10/2012 |
| JP | 2013-65774 A | 4/2013 |

OTHER PUBLICATIONS

International Search Report in PCT Application No. PCT/JP2015/054879, dated Mar. 24, 2015.

Notice of Allowance in U.S. Appl. No. 15/514,615, dated Aug. 25, 2017.

* cited by examiner

SEMICONDUCTOR DEVICE

RELATED APPLICATIONS

The present application is a National Phase of International Application Number PCT/JP2015/054880, filed Feb. 20, 2015.

TECHNICAL FIELD

The present invention relates to a semiconductor device.

BACKGROUND ART

Conventionally, there has been known a semiconductor device having a so-called shield gate structure (see patent literature 1, for example). As shown in FIG. 21A, a conventional semiconductor device 900 includes: a semiconductor base body 910 having an n+ type drain region 912, an n− type drift region 914, a p type base region 916 and an n+ type source region 918; a trench 922 formed in the inside of the semiconductor base body 910, having a bottom disposed adjacently to the n− type drift region 914 and a side wall disposed adjacently to the p type base region 916 and the n− type drift region 914, and formed into a stripe pattern as viewed in a plan view; a gate electrode 926 disposed in the inside of the trench 922 and oppositely facing the p type base region 916 with a gate insulating film 924 interposed therebetween on a portion of the side wall; a shield electrode 930 disposed in the inside of the trench 922 and positioned between the gate electrode 926 and the bottom of the trench 922; an electric insulating region 928 disposed in the inside of the trench 922, the electric insulating region 928 expanding between the gate electrode 926 and the shield electrode 930, and further expanding along the side wall and the bottom of the trench 922 so as to separate the shield electrode 930 from the side wall and the bottom; a source electrode 934 formed above the semiconductor base body 910 and electrically connected to the source region 918 and the shield electrode 930; and a drain electrode 936 formed adjacently to the n+ type drain region 912.

The conventional semiconductor device 900 includes the shield electrode 930 disposed in the inside of the trench 922 and positioned between the gate electrode 926 and the bottom of the trench 922. Accordingly, a gate-drain capacitance $C_{GD}$ (see FIG. 21B) is lowered. As a result, a gate charge current amount and a gate discharge current amount are lowered and hence, a switching speed can be increased. Further, a distance between a corner portion of the trench 922 where the concentration in an electric field is liable to occur to the gate electrode 926 can be increased. Still further, an electric field can be attenuated in the electric insulating region 928 and hence, a withstand voltage can be increased.

CITATION LIST

Patent Literature

PTL 1: Japanese Patent No. 4790908

SUMMARY OF INVENTION

Technical Problem

However, from studies which the inventors of the present invention have made, it has been found that, in the conventional semiconductor device 900, there arises a case where ringing occurs or a high surge voltage is generated at the time of turning off a switch. Accordingly, the inventors of the present invention have considered the use of a high resistance shield electrode (for example, a shield electrode having higher resistance than the source electrode or the gate electrode) as the shield electrode (see FIG. 2A). With such a configuration, due to high internal resistance in the shield electrode, a change in potential of the drain electrode can be attenuated at the time of turning off a switch and hence, ringing which occurs at the time of turning off a switch can be suppressed and, along with the suppression of occurrence of ringing, a surge voltage which occurs at the time of turning off a switch can be reduced.

However, when the high resistance shield electrode is used as the shield electrode as described above, in the latter half of a switching period, a difference in potential is generated along a line of the shield electrode and hence, a gate voltage $V_{GS}$ rises through a gate-source capacitance $C_{GS}$ (see FIG. 21A and FIG. 21B, also see FIG. 2A and FIG. 2B) thus giving rise to a drawback that an erroneous operation (self turn-on) is liable to occur (see symbol A in FIG. 2B). Further, a switching speed becomes slow (see FIG. 2B) thus giving rise to a drawback that a switching loss is increased.

On the other hand, when a low resistance shield electrode is used as the shield electrode (see FIG. 3A), a change in potential of the drain electrode cannot be attenuated at the time of turning off a switch and hence, it is difficult to acquire an advantageous effect that ringing is suppressed and, along with the suppression of occurrence of ringing, a surge voltage is lowered (see FIG. 3B).

The present invention has been made to overcome such drawbacks, and it is an object of the present invention to provide a semiconductor device which can suppress ringing which occurs at the time of turning off a switch and, along with the suppression of occurrence of ringing, can lower a surge voltage at the time of turning off a switch. The semiconductor device can also suppress an erroneous operation (self turn-on) which occurs due to rising of a gate voltage $V_{GS}$ at the time of turning off a switch and, at the same time, the semiconductor device can reduce a drawback that a switching loss is increased.

Solution to Problem

[1] According to one aspect of the present invention, there is provided a semiconductor device which includes:

a semiconductor base body having a drain region of a first conductive type, a drift region of the first conductive type disposed adjacently to the drain region, a base region of a second conductive type disposed adjacently to the drift region, and a source region of the first conductive type disposed adjacently to the base region, and having a trench in the inside of there, the trench having a bottom disposed adjacently to the drift region and a side wall disposed adjacently to the base region and the drift region, the trench being formed into a stripe pattern as viewed in a plan view;

a gate electrode disposed in the inside of the trench and oppositely facing the base region with a gate insulating film interposed therebetween on a portion of the side wall;

a shield electrode disposed in the inside of the trench and positioned between the gate electrode and the bottom of the trench;

an electric insulating region disposed in the inside of the trench, the electric insulating region expanding between the gate electrode and the shield electrode, and further expanding along the side wall and the bottom of the trench so as to separate the shield electrode from the side wall and the bottom;

a source electrode formed above the semiconductor base body and electrically connected to the source region and the shield electrode; and a drain electrode formed adjacently to the drain region, wherein the shield electrode has high resistance regions formed at positions where the high resistance regions opposedly face the side walls, and a low resistance region formed at a position where the low resistance region is sandwiched between the high resistance regions.

The above-mentioned high resistance region may be also referred to as a first region which is formed at a position where the high resistance region opposedly faces the side wall and has first resistance along a longitudinal direction of the shield electrode, and the above-mentioned low resistance region may be also referred to as a second region which is formed at a position where the low resistance region is sandwiched between the high resistance regions and has second resistance higher than the first resistance along the longitudinal direction of the shield electrode.

[2] In the semiconductor device of the present invention, it is preferable that both the high resistance regions and the low resistance region be made of a same semiconductor material containing a dopant, and dopant concentration in the low resistance region be higher than dopant concentration in the high resistance regions.

[3] In the semiconductor device of the present invention, it is preferable that the high resistance regions and the low resistance region be made of different materials respectively, and electric resistivity of the material for forming the low resistance region be lower than electric resistivity of the material for forming the high resistance regions.

[4] In the semiconductor device of the present invention, it is preferable that both the high resistance regions and the low resistance region be made of a same material, and a cross-sectional area of the low resistance region taken along a plane orthogonal to a stripe longitudinal direction of the shield electrode be larger than a cross-sectional area of the high resistance region taken along a plane orthogonal to the stripe longitudinal direction of the shield electrode.

[5] In the semiconductor device of the present invention, it is preferable that the high resistance regions and the low resistance region be disposed at a position where the high resistance regions and the low resistance region are brought into contact with each other.

[6] In the semiconductor device of the present invention, it is preferable that the high resistance regions and the low resistance region be disposed at positions spaced apart from each other with the electric insulating region interposed therebetween.

[7] In the semiconductor device of the present invention, it is preferable that, in the electric insulating region, the electric insulating regions sandwiched between the high resistance regions and the low resistance region have opening portions partially, and the high resistance regions and the low resistance region be brought into contact with each other partially through the opening portions.

[8] In the semiconductor device of the present invention, it is preferable that a thickness of the low resistance region be thinner than a thickness of the high resistance region.

[9] In the semiconductor device of the present invention, it is preferable that a thickness of the high resistance region be thinner than a thickness of the low resistance region.

Advantageous Effects of the Invention

The semiconductor device of the present invention includes, as the shield electrode thereof, a shield electrode having high resistance regions formed at the positions where the high resistance regions opposedly face the side walls of the trench, and the low resistance region formed at the position where the low resistance region is sandwiched between the high resistance regions (see FIG. 1A). Accordingly, in the high resistance regions, a resistance value of a resistance Ra (see FIG. 4A and FIG. 4B) in the regions is higher than a resistance value of a resistance Rb (see FIG. 4A and FIG. 4B) and hence, a change in potential of the drain electrode at the time of turning off a switch can be attenuated. Accordingly, it is possible to suppress ringing which occurs at the time of turning off a switch and, along with the suppression of occurrence of ringing, it is possible to lower a surge voltage generated at the time of turning off a switch (see FIG. 1B). Further, in the low resistance region, a resistance value of a resistance Rb (see FIG. 4A and FIG. 4B) in the region is lower than a resistance value of a resistance Ra (see FIG. 4A and FIG. 4B) and hence, a difference in potential of the shield electrode generated along a line of the shield electrode can be lowered whereby an erroneous operation (self turn-on) generated due to rising of a gate voltage $V_{GS}$ in the latter half of a switching period can be suppressed (see symbol A in FIG. 1B). Further, due to the presence of the low resistance region, a switching speed can be increased (see FIG. 1B) and hence, the increase of a switching loss can be prevented.

BRIEF DESCRIPTION OF DRAWINGS

FIG. 1A and FIG. 1B are views for describing a semiconductor device 100 according to an embodiment 1, wherein FIG. 1A is a cross-sectional view of the semiconductor device 100 and FIG. 1B is a view showing a response waveform at the time of turning off a switch of the semiconductor device 100.

FIG. 2A and FIG. 2B are views for describing a semiconductor device 100a according to a comparison example 1, wherein FIG. 2A is a cross-sectional view of the semiconductor device 100a and FIG. 2B is a view showing a response waveform at the time of turning off a switch of the semiconductor device 100a.

FIG. 3A and FIG. 3B are views for describing a semiconductor device 100b according to a comparison example 2, wherein FIG. 3A is a cross-sectional view of the semiconductor device 100b and FIG. 3B is a view showing a response waveform at the time of turning off a switch of the semiconductor device 100b.

FIG. 4A and FIG. 4B are views for describing a manner of operation and an advantageous effect acquired by the semiconductor device 100 according to the embodiment 1, wherein FIG. 4A is a view where parasitic resistances and parasitic capacitances are additionally described in a cross-sectional view of the semiconductor device 100 and FIG. 4B is an equivalent circuit diagram of the semiconductor device 100.

FIG. 5A to FIG. 5D are views for describing a method of manufacturing the semiconductor device 100 according to the embodiment 1, wherein FIG. 5A to FIG. 5D are views showing respective steps.

FIG. 6A to FIG. 6D are views for describing the method of manufacturing the semiconductor device 100 according to the embodiment 1, wherein FIG. 6A to FIG. 6D are views showing respective steps.

FIG. 7A to FIG. 7D are views for describing the method of manufacturing the semiconductor device 100 according to the embodiment 1, wherein FIG. 7A to FIG. 7D are views showing respective steps.

FIG. 8A to FIG. 8D are views for describing the method of manufacturing the semiconductor device 100 according to the embodiment 1, wherein FIG. 8A to FIG. 8D are views showing respective steps.

FIG. 11A and FIG. 11B are views for describing a semiconductor device 103 according to a modification 1, wherein FIG. 11A is a cross-sectional view of the semiconductor device 103 and FIG. 11B is a cross-sectional view taken along a line B-B in FIG. 11A.

FIG. 17A to FIG. 17D are views for describing another method of manufacturing the semiconductor device 100 according to the embodiment 1, wherein FIG. 17A to FIG. 17D are views showing respective steps. Steps substantially equal to steps shown in FIG. 5A to FIG. 8D are omitted in FIG. 17A to FIG. 17D.

FIG. 18A to FIG. 18C are views for describing another method of manufacturing the semiconductor device 100 according to the embodiment 1, wherein FIG. 18A to FIG. 18C are views showing respective steps. Steps substantially equal to steps shown in FIG. 5A to FIG. 8D are omitted in FIG. 18A to FIG. 18C.

FIG. 19A to FIG. 19D are views for describing still another method of manufacturing the semiconductor device 100 according to the embodiment 1, wherein FIG. 19A to FIG. 19D are views showing respective steps. Steps substantially equal to steps shown in FIG. 5A to FIG. 8D are omitted in FIG. 19A to FIG. 19D.

FIG. 20A to FIG. 20D are views for describing still another method of manufacturing the semiconductor device 100 according to the embodiment 1, wherein FIG. 20A to FIG. 20D are views showing respective steps. Steps substantially equal to steps shown in FIG. 5A to FIG. 8D are omitted in FIG. 20A to FIG. 20D.

FIG. 21A and FIG. 21B are views for describing a conventional semiconductor device 900, wherein FIG. 21A is a cross sectional view where parasitic resistances and parasitic capacitances are additionally described in a cross-sectional view of the semiconductor device 900, and FIG. 21B is an equivalent circuit diagram of the semiconductor device 900.

DESCRIPTION OF EMBODIMENTS

Figure 1A:
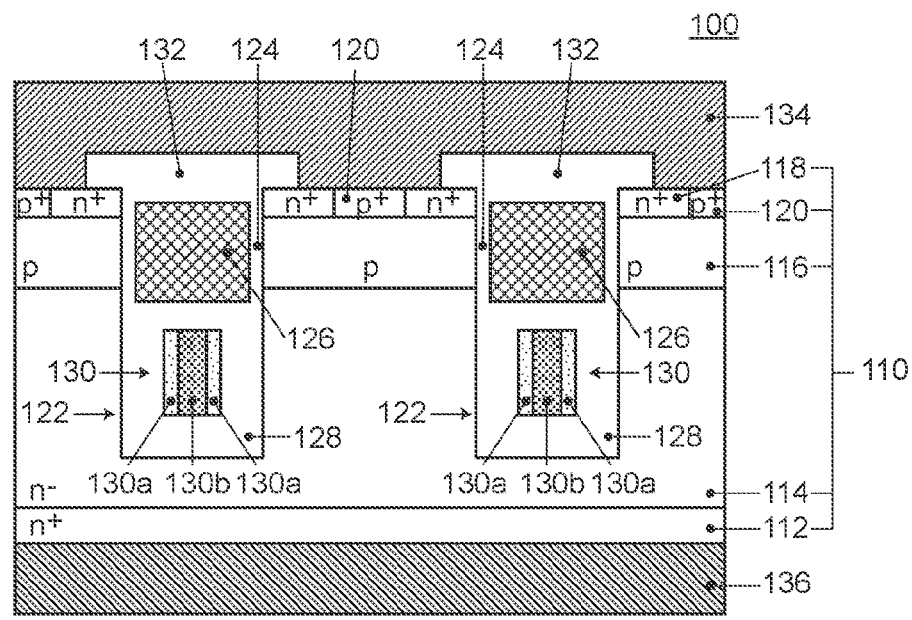

Hereinafter, a semiconductor device according to the present invention is described in conjunction with embodiments shown in the drawings.

Embodiment 1

1. Semiconductor Device

As shown in FIG. 1A, a semiconductor device 100 according to an embodiment 1 includes: a semiconductor base body 110 having an $n^+$ type drain region (a drain region of a first conductive type) 112, an $n^-$ type drift region (a drift region of the first conductive type) 114 disposed adjacently to the $n^+$ type drain region 112, a p type base region (a base region of a second conductive type) 116 disposed adjacently to the $n^-$ type drift region 114 and an $n^+$ type source region (a source region of the first conductive type) 118 disposed adjacently to the p type base region 116; a trench 122 formed in the inside of the semiconductor base body 110, having a bottom disposed adjacently to the $n^-$ type drift region 114 and a side wall disposed adjacently to the p type base region 116 and the $n^-$ type drift region 114, and formed into a stripe pattern as viewed in a plan view; a gate electrode 126 disposed in the inside of the trench 122 and oppositely facing the p type base region 116 with a gate insulating film 124 interposed therebetween on a portion of the side wall; a shield electrode 130 disposed in the inside of the trench 122 and positioned between the gate electrode 126 and the bottom of the trench 122; an electric insulating region 128 disposed in the inside of the trench 122, the electric insulating region 128 expanding between the gate electrode 126 and the shield electrode 130, and further expanding along the side wall and the bottom of the trench 122 so as to separate the shield electrode 130 from the side wall and the bottom; a source electrode 134 formed above the semiconductor base body 110 and electrically connected to the source region 118 and the shield electrode 130; and a drain electrode 136 formed adjacently to the $n^+$ type drain region 112.

The semiconductor base body 110 have a trench 122 in the inside of there. The trench 122 have a bottom disposed adjacently to the $n^-$ type drift region 114 and a side wall disposed adjacently to the p type base region 116 and the $n^-$ type drift region 114. Also the trench(s) 122 are formed into a stripe pattern as viewed in a plan view.

The semiconductor device 100 according to the embodiment 1 is a power MOSFET.

In the semiconductor device 100 according to the embodiment 1, the shield electrode 130 has high resistance regions 130a formed at positions where the high resistance regions 130a oppositely face the side walls of the trench, and a low resistance region 130b formed at a position where the low resistance region 130b is sandwiched between the high resistance regions 130a. Both the high resistance region 130a and the low resistance region 130b are made of a same semiconductor material containing a dopant, and dopant concentration in the low resistance region 130b is higher than dopant concentration in the high resistance region 130a. The high resistance region 130a and the low resistance region 130b are disposed at a position where the high resistance region 130a and the low resistance region 130b are brought into contact with each other.

A thickness of the $n^+$ type drain region 112 is set to a value which falls within a range of from 50 μm to 500 μm (for example, 350 μm), and dopant concentration in the type drain region 112 is set to $1\times10^{18}$ cm$^{-3}$ to $1\times10^{20}$ cm$^{-3}$ (for example, $1\times10^{19}$ cm$^{-3}$). A thickness of the $n^-$ type drift region 114 is set to a value which falls within a range of from 10 μm to 50 μm (for example, 15 μm), and dopant concentration in the $n^-$ type drift region 114 is set to $1\times10^{14}$ cm$^{-3}$ to $1\times10^{17}$ cm$^{-3}$ (for example, $1\times10^{15}$ cm$^{-3}$). A thickness of the p type base region 116 is set to a value which falls within a range of from 2 µm to 10 µm (for example, 5 µm), and dopant concentration in the p type base region 116 is set to $1×10^{16}$ cm$^{-3}$ to $1×10^{18}$ cm$^{-3}$ (for example, $1×10^{17}$ cm$^{-3}$).

Figure 1B:
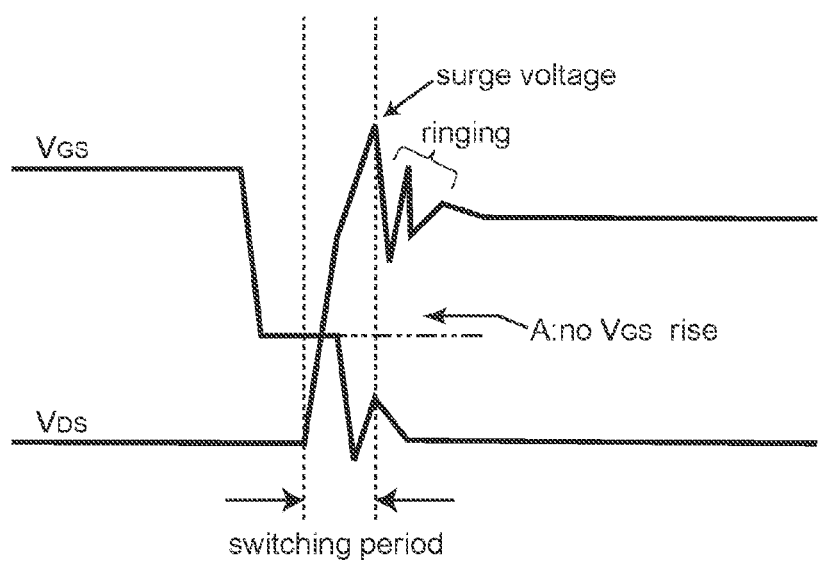
Figure 2A:
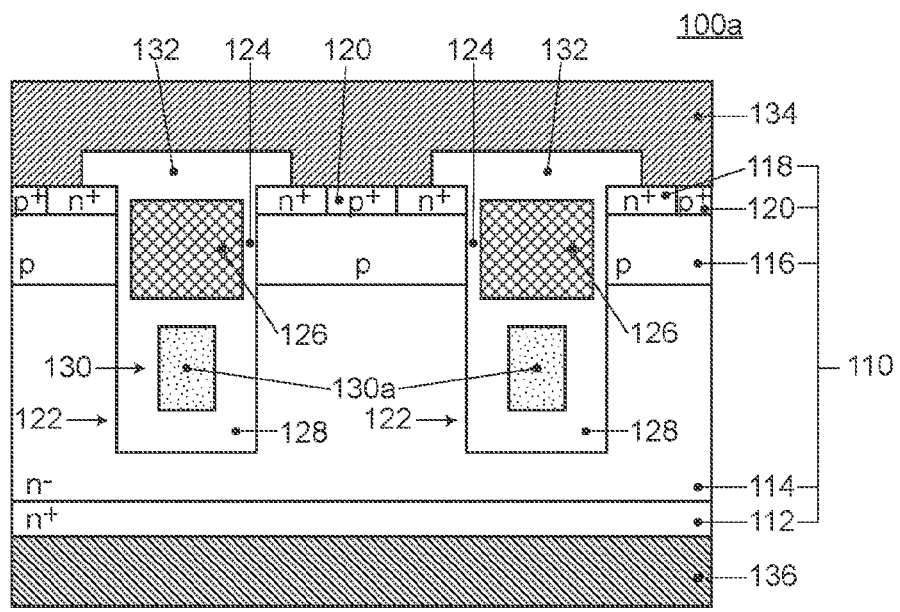
Figure 2B:
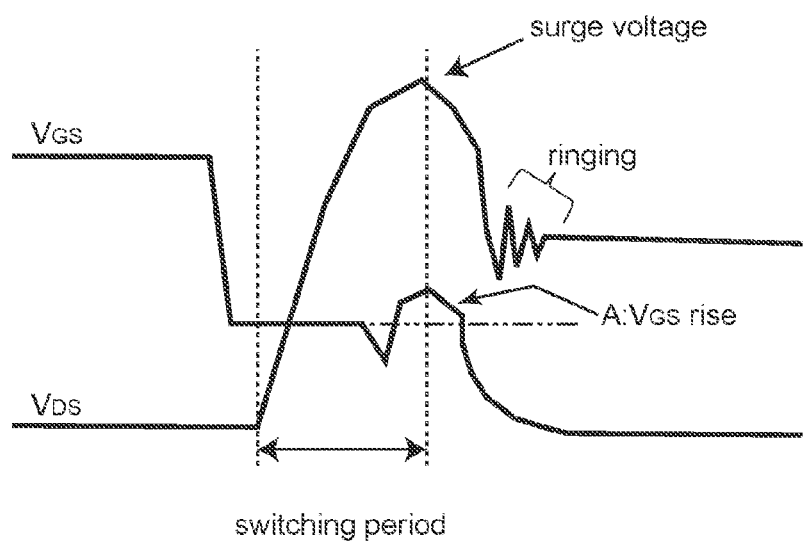
Figure 3A:
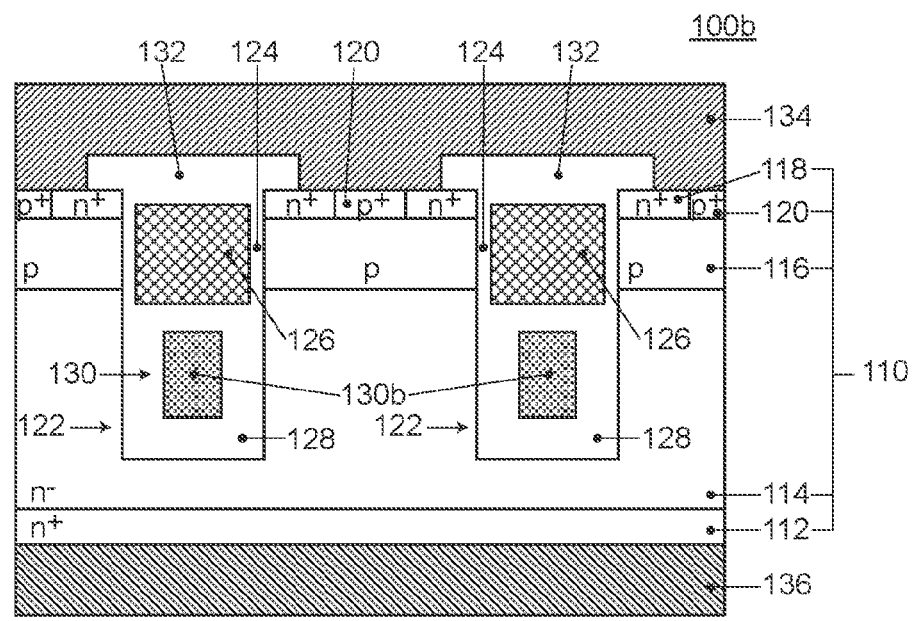
Figure 3B:
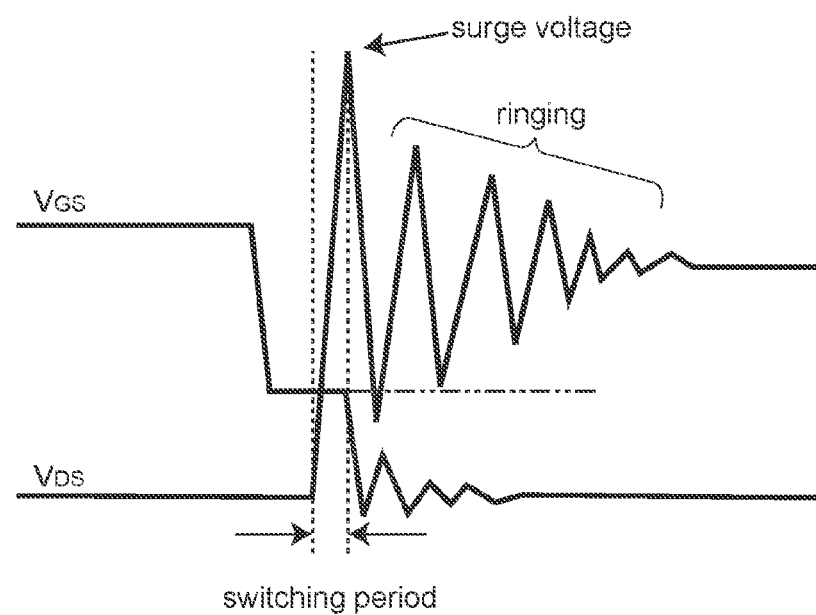

By defining a depth direction of the trench 122 as a vertical direction and a direction which is orthogonal to the depth direction and connects one side wall and the other side wall of the trench 122 as a lateral direction (see FIG. 1A, FIG. 1B and the like), a depth of the trench 122 in the vertical direction is set to a value which falls within a range of from 4 µm to 20 µm (for example, 10 µm), a width of the trench 122 in the lateral direction is set to a value which falls within a range of from 1.5 µm to 7.5 µm (for example, 5 µm), and a pitch of the trench 122 is set to a value which falls within a range of from 3 µm to 15 µm (for example, 10 µm).

The gate insulating film 124 is formed of a silicon dioxide film formed by a thermal oxidation method, for example, and a thickness of the gate insulating film 124 is set to a value which falls within a range of from 20 nm to 200 nm (for example, 100 nm).

The gate electrode 126 is formed of a low resistance polysilicon formed by a CVD method, for example, and a thickness of the gate electrode 126 is set to a value which falls within a range of from 2 µm to 10 µm (for example, 5 µm).

The shield electrode 130 is, as described previously, disposed in the inside of the trench 122 and positioned between the gate electrode 126 and the bottom of the trench 122. A thickness of the shield electrode 130 in the vertical direction is set to a value which falls within a range of from 1.5 µm to 6 µm (for example, 4 µm), and a thickness of the shield electrode 130 in the lateral direction is set to a value which falls within a range of from 1 µm to 5 µm (for example, 2.5 µm). The high resistance region 130a is made of a high resistance polysilicon and is formed by a CVD method, for example, and a thickness of the high resistance region 130a in the lateral direction is set to a value which falls within a range of from 0.4 µm to 2 µm (for example, 1 µm). The low resistance region 130b is made of a low resistance polysilicon doped with a dopant and is formed by a CVD method, for example, and a thickness of the low resistance region 130b in the lateral direction is set to a value which falls within a range of from 0.2 µm to 1 µm (for example, 0.5 µm).

A distance between the shield electrode 130 and the gate electrode 126 is set to a value which falls within a range of from 1 µm to 3 µm (for example, 2 µm), a distance between the shield electrode 130 and the bottom of the trench 122 is set to a value which falls within a range of from 1 µm to 3 µm (for example, 2 µm), and a distance between the shield electrode 130 and the side wall of the trench 122 is set to a value which falls within a range of from 1 µm to 3 µm (for example, 2 µm).

A depth of the type source region 118 is set to a value which falls within a range of from 1 µm to 3 µm (for example, 2 µm), and dopant concentration in the type source region 118 is set to $1×10^{18}$ cm$^{-3}$ to $1×10^{20}$ cm$^{-3}$ (for example, $2×10^{19}$ cm$^{-3}$).

A depth of the type contact region 120 is set to a value which falls within a range of from 1 µm to 3 µm (for example, 2 µm), and dopant concentration in the p type contact region 126 is set to $1×10^{18}$ cm$^{-3}$ to $1×10^{20}$ cm$^{-3}$ (for example, $2×10^{19}$ cm$^{-3}$).

An interlayer insulating film 132 is formed of a silicon dioxide film formed by a CVD method, for example, and a thickness of the interlayer insulating film 132 is set to a value which falls within a range of from 0.5 µm to 3 µm (for example, 1 µm).

The source electrode 134 is formed of an Al film or an Al alloy film (for example, an AlSi film), for example, and a thickness of the source electrode 134 is set to a value which falls within a range of from 1 µm to 10 µm (for example, 3 µm).

The drain electrode 136 is formed of a lamination film in which Ti, Ni, and Au are laminated in this order, and a thickness of the drain electrode 136 is set to a value which falls within a range of from 0.2 µm to 1.5 µm (for example, 1 µm).

2. Advantageous Effects of Semiconductor Device

Figure 4A:
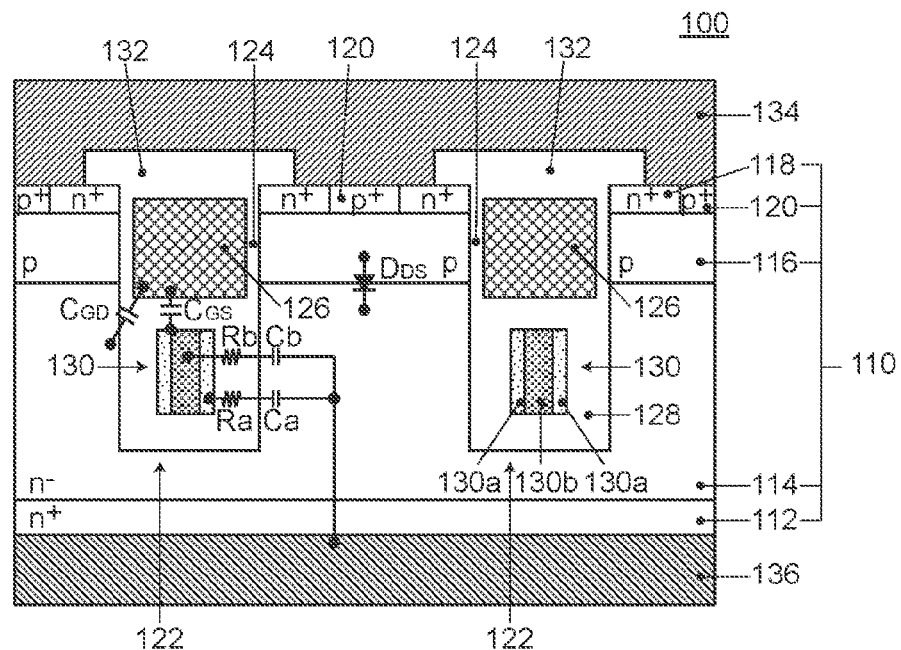
Figure 4B:
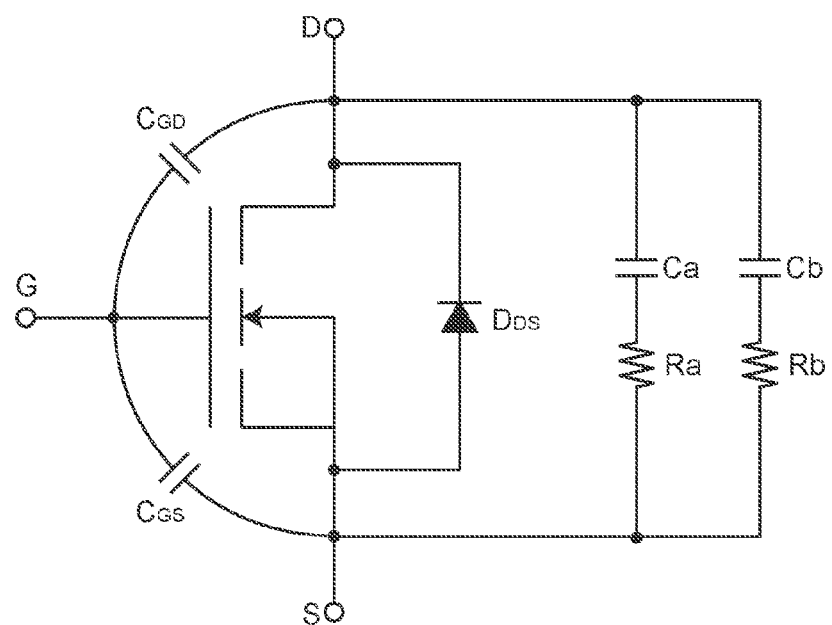

The semiconductor device 100 according to the embodiment 1 includes, as the shield electrode thereof, a shield electrode 130 having high resistance regions 130a formed at positions where the high resistance regions 130a opposedly face the side walls of the trench and a low resistance region 130b formed at a position where the low resistance region 130b is sandwiched between the high resistance regions 130a (see FIG. 1A). In the high resistance region 130a, a resistance value of a resistance Ra (see FIG. 4A and FIG. 4B) in the region is higher than a resistance value of a resistance Rb (see FIG. 4A and FIG. 4B) and hence, a change in potential of the drain electrode at the time of turning off a switch can be attenuated. Particularly, among the inner walls (side walls and bottom) of the trench, the high resistance regions 130a mainly face the side walls where an opposedly facing area is larger than an opposedly facing area on the bottom. Accordingly, an effect from the drift region (or the inner walls of the trench) at the time of turning off a switch can be effectively suppressed, and a change in potential of the drain electrode at the time of turning off a switch can be effectively attenuated. In this manner, it is possible to suppress ringing which occurs at the time of turning off a switch and, along with the suppression of occurrence of ringing, it is possible to lower a surge voltage generated at the time of turning off a switch (see FIG. 1B). Further, in the low resistance region 130b, a resistance value of a resistance Rb (see FIG. 4A and FIG. 4B) in the region is lower than a resistance value of a resistance Ra (see FIG. 4A and FIG. 4B) and hence, a difference in potential of the shield electrode 130 generated along a line of the shield electrode 130 can be lowered whereby an erroneous operation (self turn-on) generated due to rising of a gate voltage $V_{GS}$ in the latter half of a switching period can be suppressed (see symbol A in see FIG. 1B). Further, due to the presence of the low resistance region 130b, a switching speed can be increased (see FIG. 1B) and hence, the increase of a switching loss can be prevented.

The semiconductor device 100 according to the embodiment 1 includes, as the shield electrode 130 thereof, a shield electrode in which both the high resistance region 130a and the low resistance region 130b are made of the same semiconductor material containing a dopant, and dopant concentration in the low resistance region 130b is higher than dopant concentration in the high resistance region 130a. Accordingly, by setting a doping amount of a dopant to a suitable value, it is possible to relatively easily set electric resistivity of the high resistance region 130a and electric resistivity of the low resistance region 130b to desired values.

Further, the semiconductor device 100 of the embodiment 1 includes, as the shield electrode 130, a shield electrode disposed at a position where the high resistance region 130a and the low resistance region 130b are brought into contact with each other and hence, it is possible to relatively easily form the shield electrode structure as can be also understood from a method of manufacturing a semiconductor device described later.

3. Method of Manufacturing Semiconductor Device

The semiconductor device 100 according to the embodiment 1 can be manufactured by a manufacturing method having the following manufacturing steps (method of manufacturing a semiconductor device according to the embodiment 1).

(1) Semiconductor Base Body Preparing Step

Figure 5A:
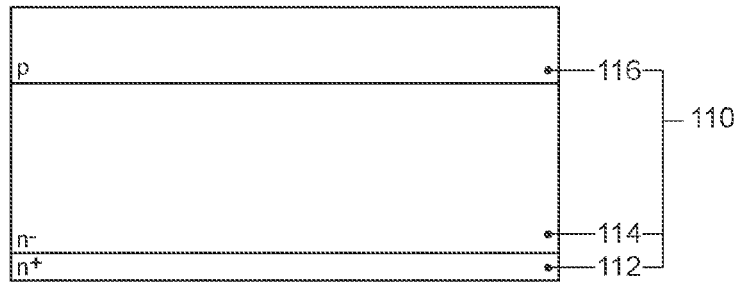
Figure 5B:
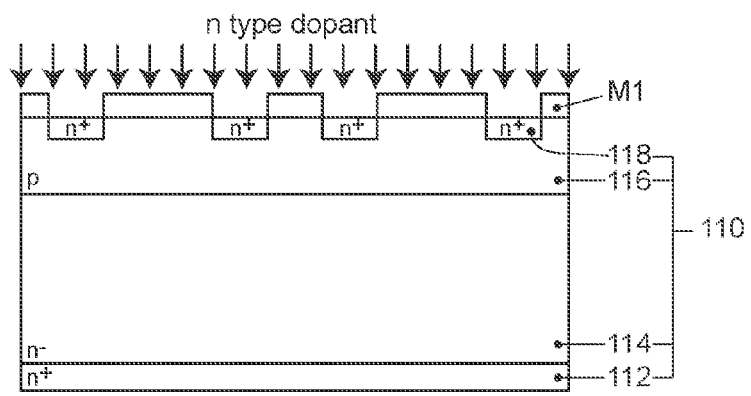
Figure 5C:
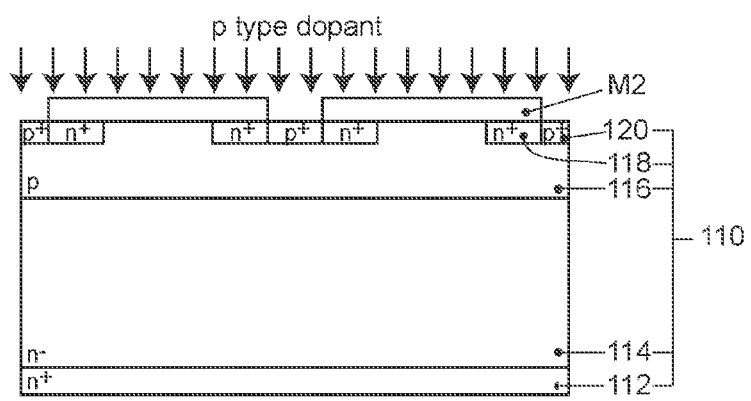

As shown in FIG. 5A to FIG. 5C, there is prepared a semiconductor base body 110 which includes: an $n^-$ type drain region 112; an $n^-$ type drift region 114 disposed adjacently to the $n^+$ type drain region 112; a p type base region 116 disposed adjacently to the $n^-$ type drift region 114; and an $n^+$ type source region 118 disposed adjacently to the p type base region 116; and a $p^+$ type contact region 120.

(2) Trench Forming Step

Figure 5D:
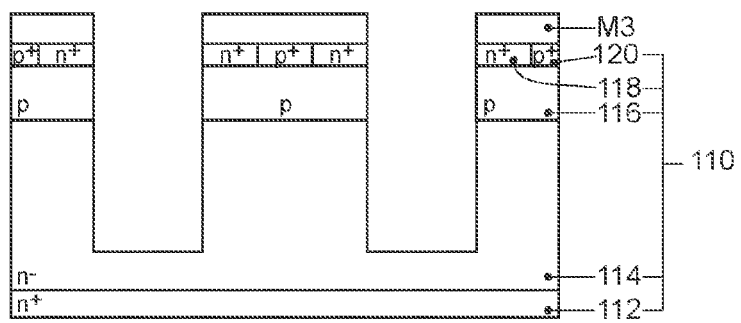

Then, as shown in FIG. 5D, a mask M3 is formed on a surface of the semiconductor base body 110, and a trench 122 is formed using the mask M3 as a mask such that the trench 122 reaches the $n^-$ type drift layer 114 from a surface of the p type base region 116. A depth of the trench 122 is set to 11 µm, for example.

(3) First Electric Insulating Region Forming Step

Figure 6A:
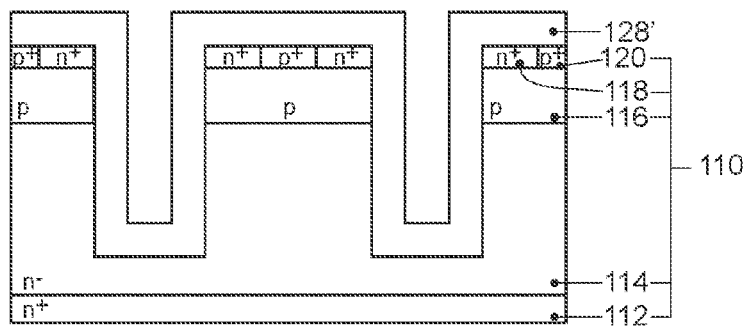

Then, as shown in FIG. 6A, a silicon oxide film 128' is formed on an inner surface of the trench 122 and a surface of the semiconductor base body 110 by a thermal oxidation method thus forming a bottom portion and a side wall portion of the electric insulating region 128. In the first electric insulating region forming step, the silicon oxide film 128' on the bottom portion may be formed with a large thickness by a CVD method and, then, the silicon oxide film 128' on the side wall portion may be formed by a thermal oxidization method.

(4) High Resistance Region and Low Resistance Region Forming Step

Figure 6B:
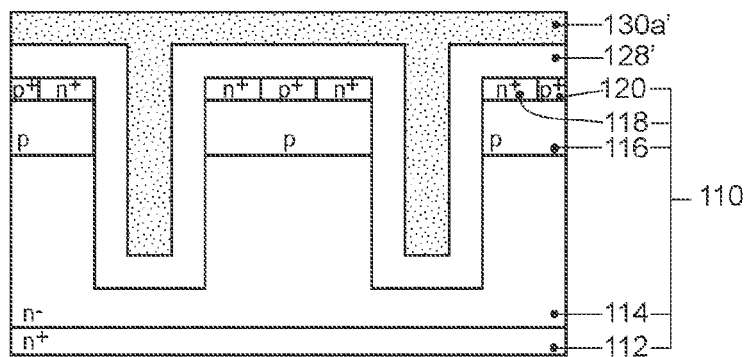
Figure 6C:
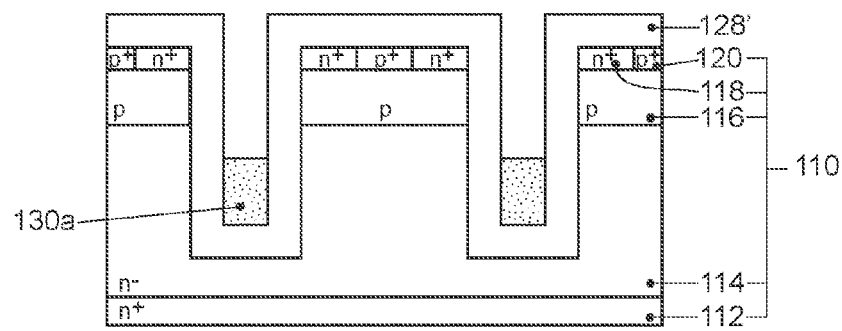

Then, as shown in FIG. 6B, a high resistance polysilicon film 130a' is formed in the trench 122 and on the surface of the semiconductor base body 110 by a CVD method. Then, as shown in FIG. 6C, the high resistance polysilicon film 130a' is etched back so as to remove the high resistance polysilicon film 130a' in a state where the high resistance polysilicon film 130a' having a predetermined thickness remains on the bottom portion of the electric insulating region 128 in the trench 122. With such processing, a base portion for forming high resistance regions 130a is formed on the bottom portion of the electric insulating region 128 in the trench 122. As described later, with respect to the base portion for forming the high resistance regions 130a, portions of the base portion on both side wall sides are maintained as it is so as to form the high resistance regions 130a, and a portion of the base portion sandwiched between the high resistance regions 130a is formed into the low resistance region 130b through following predetermined steps.

Figure 6D:
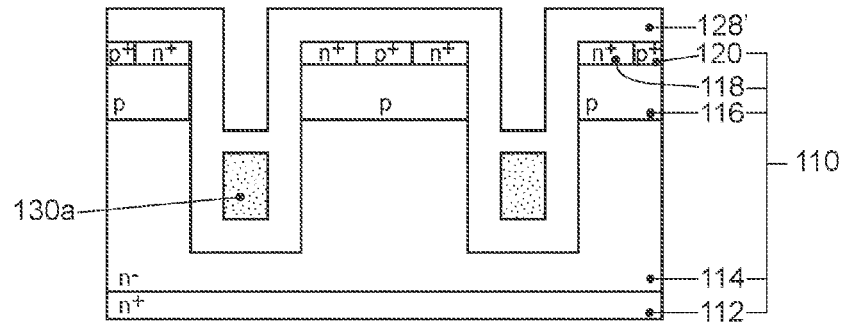

Then, as shown in FIG. 6D, a silicon oxide film 128' having a predetermined thickness is formed on the base portion of the high resistance region 130a formed in the trench 122 and a surface of the semiconductor base body 110 by a thermal oxidation method.

Figure 7A:
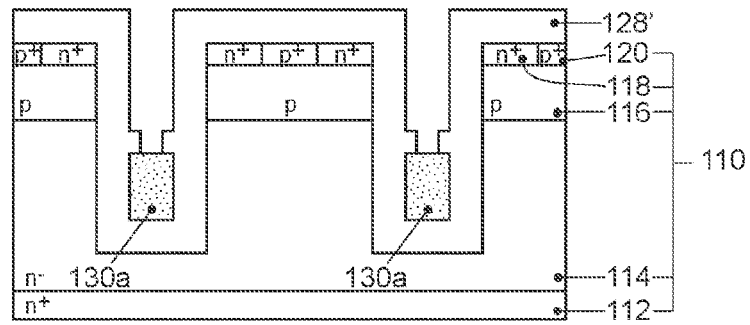
Figure 7B:
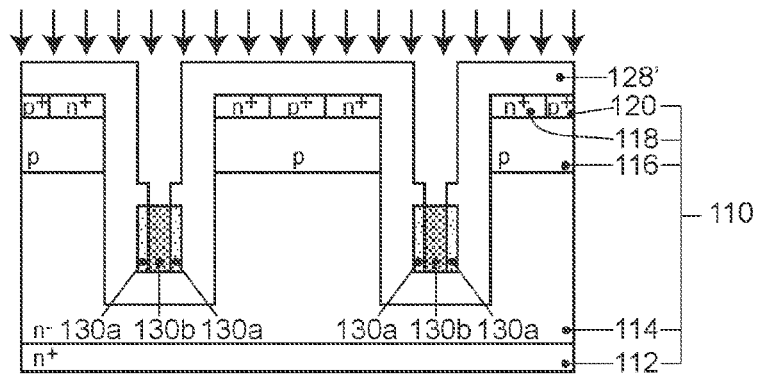

Next, as shown in FIG. 7A, an opening portion having a predetermined width is formed in the silicon oxide film 128' at a position corresponding to the low resistance region 130b. Then, as shown in FIG. 7B, using the opening portion as a mask, the high resistance region 130a is doped with a dopant at a doping concentration corresponding to desired resistivity. With such processing, a low resistance region 130b is formed in the trench 122. As a whole, a shield electrode 130 having the high resistance regions 130a and the low resistance region 130b which is formed at the position where the low resistance region 130b is sandwiched between the high resistance regions 130a is formed. The shield electrode 130 is formed such that a portion of or the whole shield electrode 130 is disposed at a position deeper than a bottom portion of a p type base region 116.

Figure 7C:
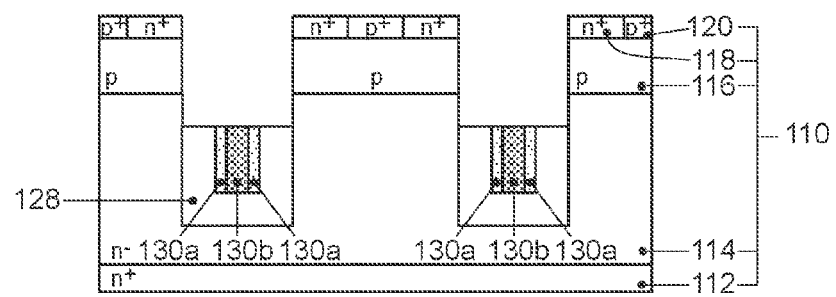

Then, as shown in FIG. 7C, the silicon oxide film 128' is removed by etching.

(5) Second Electric Insulating Region Forming Step

Then, a silicon oxide film is formed on a whole surface of the semiconductor base body 110 such that the silicon oxide film covers the inside of the trench 122 by a CVD method. Next, the silicon oxide film is etched back to a position disposed below a gate electrode 126 described later at a predetermined depth. The silicon oxide film of a predetermined thickness which remains after such etching back forms a top portion of an electric insulating region 128.

(6) Gate Insulating Film Forming Step

Figure 7D:
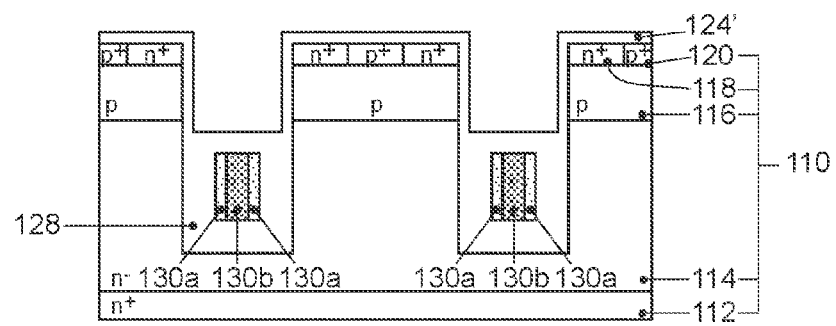

Then, as shown in FIG. 7D, by a thermal oxidation method, a silicon oxide film 124' is formed on a portion of an inner surface of the trench 122 where the insulating film 124 is to be formed and a surface of the semiconductor base body 110, and the silicon oxide film 124' forms a gate insulating film 124.

(7) Gate Electrode Forming Step

Figure 8A:
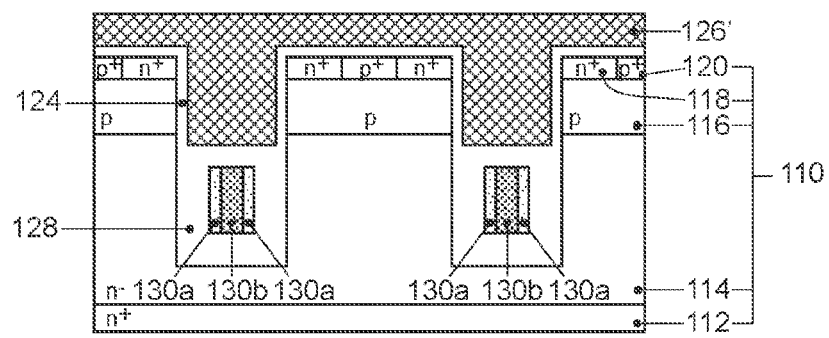
Figure 8B:
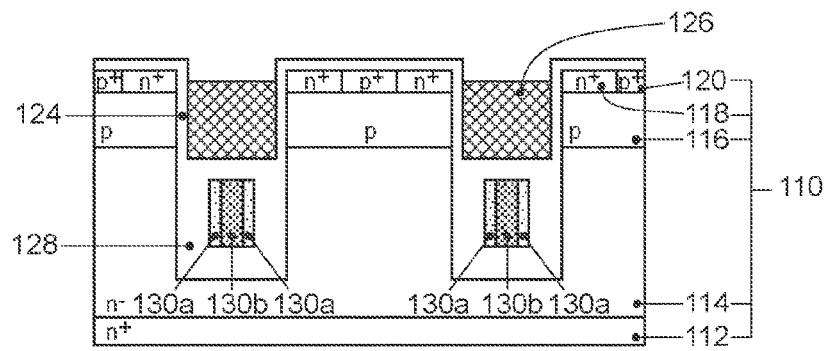

Then, as shown in FIG. 8A, a low resistance polysilicon film 126' is formed from a surface side of the semiconductor base body 110 such that the trench 122 is embedded by the low resistance polysilicon film 126'. Then, as shown in FIG. 8B, the low resistance polysilicon film 126' is etched back so as to remove the low resistance polysilicon film 126' in a state where the low resistance polysilicon film 126' remains only in the trench 122. With such processing, a gate electrode 126 is formed on an inner peripheral surface of the trench 122.

(8) Interlayer Insulating Film Forming Step

Figure 8C:
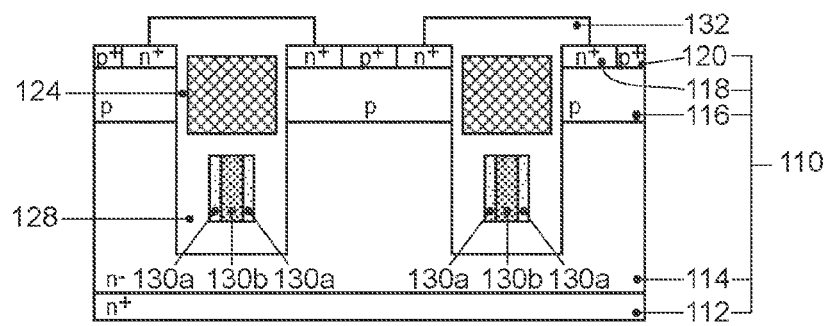

Then, the silicon oxide film 124' formed on the surface of the semiconductor base body 110 is removed. Next, a PSG film is formed from a surface side of the semiconductor base body 110 by a gas phase method. Thereafter, a thermally oxidized film of silicon and the PSG film are removed by etching while a predetermined upper portion of the gate electrode 126 remains. With such a processing, as shown in FIG. 8C, an interlayer insulating film 132 is formed on an upper portion of the gate electrode 126.

(9) Source Electrode and Drain Electrode Forming Step

Figure 8D:
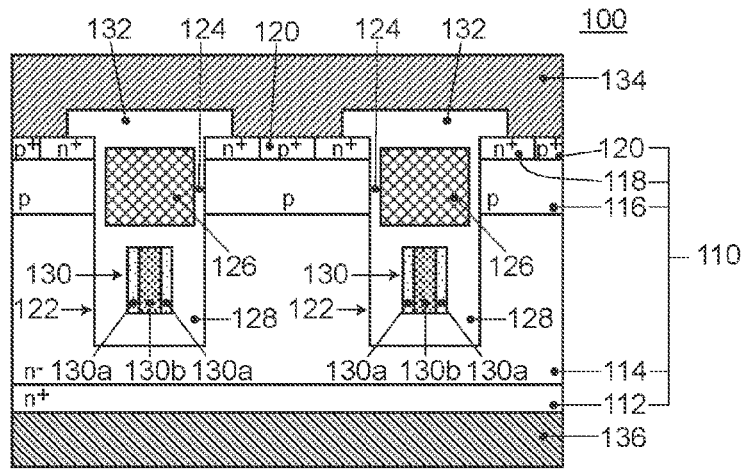

Then, as shown in FIG. 8D, a source electrode 134 is formed such that the source electrode 134 covers the semiconductor base body 110 and the interlayer insulating film 132, and a drain electrode 136 is formed on a surface of the $n^+$ type drain layer 112.

The semiconductor device 100 according to the embodiment 1 can be manufactured through the above-mentioned steps.

Embodiment 2

A semiconductor device 101 according to an embodiment 2 basically has substantially the same configuration as the semiconductor device 100 according to the embodiment 1. However, the semiconductor device 101 according to the embodiment 2 differs from the semiconductor device 100 according to the embodiment 1 with respect to the configuration of a shield electrode. That is, as shown in FIG. 9, in the semiconductor device 101 according to the embodiment 2, high resistance regions 130a and a low resistance region 130b are made of different materials respectively, and electric resistivity of a material which forms the low resistance region 130b is lower than electric resistivity of a material which forms the high resistance regions 130a (see FIG. 9).

As a material for forming the high resistance regions 130a, for example, high resistance polysilicon which is formed by a CVD method can be used. As a material for forming the low resistance region 130b, metal having a high-melting point (for example, W, Mo, Ta, Nb or the like) or other metals (for example, Cu or the like) can be used.

Figure 9:
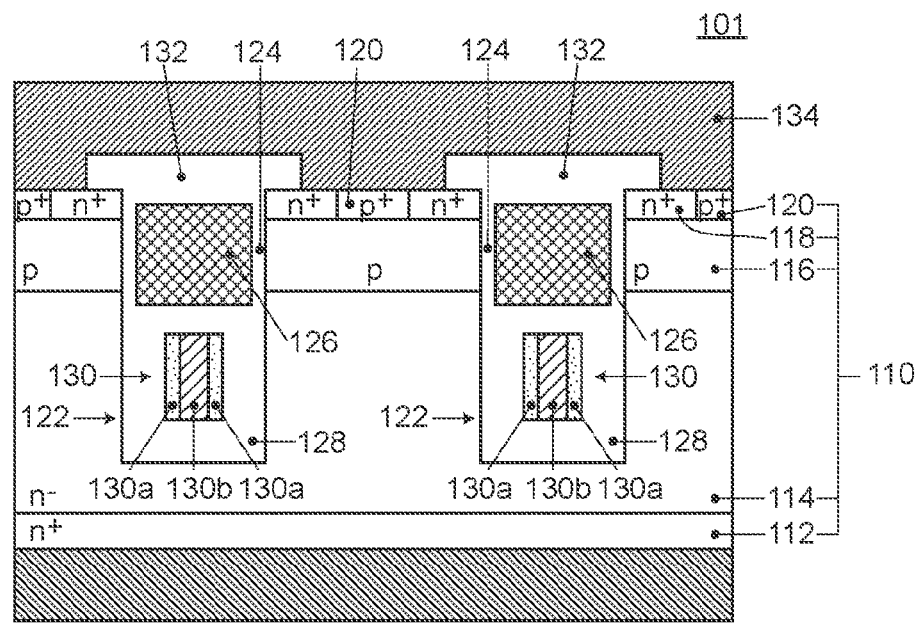
FIG. 9 is a cross-sectional view of a semiconductor device 101 according to an embodiment 2.

In this manner, although the semiconductor device 101 according to the embodiment 2 differs from the semiconductor device 100 according to the embodiment 1 with respect to the configuration of the shield electrode, the semiconductor device 101 according to the embodiment 2 includes, as a shield electrode thereof, a shield electrode 130 having the high resistance regions 130a formed at positions where the high resistance regions 130a opposedly face side walls of a trench and the low resistance region 130b formed at a position where the low resistance region 130b is sandwiched between the high resistance regions 130a (see FIG. 9). Accordingly, in the same manner as the semiconductor device 100 according to the embodiment 1, in the high resistance regions 130a, a resistance value of a resistance Ra (see FIG. 4A and FIG. 4B) in the region is higher than a resistance value of a resistance Rb (see FIG. 4A and FIG. 4B) and hence, a change in potential of a drain electrode at the time of turning off a switch can be attenuated. Accordingly, it is possible to suppress ringing which occurs at the time of turning off a switch and, along with the suppression of occurrence of ringing, it is possible to lower a surge voltage generated at the time of turning off a switch. Further, in the low resistance region 130b, a resistance value of the resistance Rb (see FIG. 4A and FIG. 4B) in the region is lower than a resistance value of the resistance Ra (see FIG. 4A and FIG. 4B) and hence, a difference in potential of the shield electrode 130 generated along a line of the shield electrode 130 can be lowered whereby an erroneous operation (self turn-on) generated due to rising of a gate voltage $V_{GS}$ in the latter half of a switching period can be suppressed. Further, due to the presence of the low resistance region, a switching speed can be increased and hence, the increase of a switching loss can be prevented.

Further, the semiconductor device 101 according to the embodiment 2 includes, as the shield electrode 130 thereof, the shield electrode where the high resistance regions 130a and the low resistance region 130b are made of different materials respectively, and electric resistivity of the material for forming the low resistance region 130b is lower than electric resistivity of the material for forming the high resistance regions 130a. Accordingly, by suitably selecting the materials of the high resistance regions 130a and the low resistance region 130b, it is possible to select electric resistivity of the high resistance regions 130a and electric resistivity of the low resistance region 130b over a wide range.

Embodiment 3

A semiconductor device 102 according to an embodiment 3 basically has substantially the same configuration as the semiconductor device 100 according to the embodiment 1. However, the semiconductor device according to the embodiment 3 differs from the semiconductor device 100 according to the embodiment 1 with respect to the configuration of a shield electrode. That is, as shown in FIG. 10, in a semiconductor device 102 according to the embodiment 3, high resistance regions 130a and a low resistance region 130b are disposed at positions spaced apart from each other with an electric insulating region 128 interposed therebetween.

Although a distance between the high resistance region 130a and the low resistance region 130b can be suitably set, for example, the distance can be set to 0.5 µm.

Figure 10:
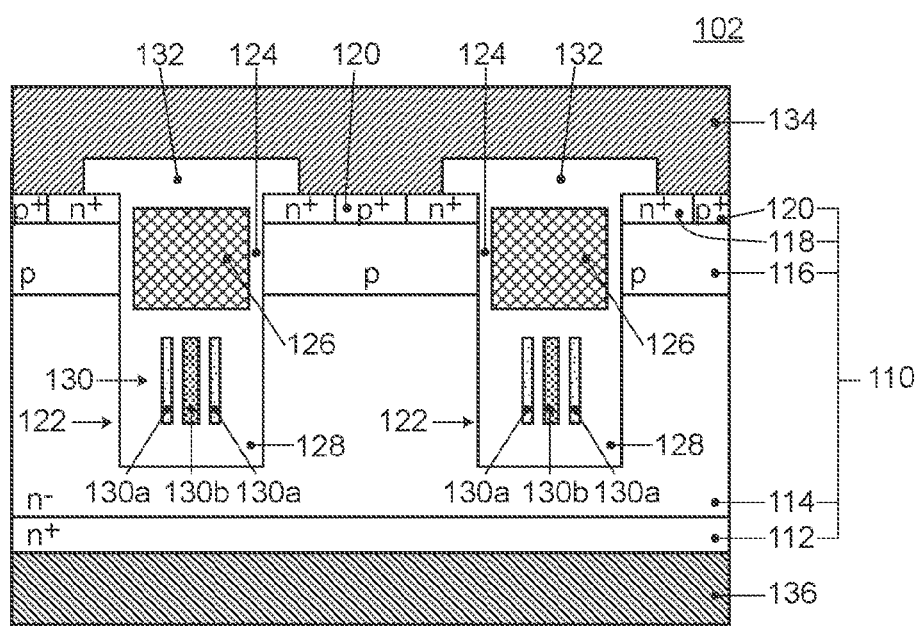
FIG. 10 is a cross-sectional view of a semiconductor device 102 according to an embodiment 3.

In this manner, although the semiconductor device 102 according to the embodiment 3 differs from the semiconductor device 100 according to the embodiment 1 with respect to the configuration of the shield electrode, the semiconductor device 102 according to the embodiment 3 includes, as a shield electrode thereof, a shield electrode 130 having high resistance regions 130a formed at positions where the high resistance regions 130a opposedly face side walls of a trench and a low resistance region 130b formed at a position where the low resistance region 130b is sandwiched between the high resistance regions 130a (see FIG. 10). Accordingly, in the same manner as the semiconductor device 100 according to the embodiment 1, in the high resistance regions 130a, a resistance value of a resistance Ra in the regions (see FIG. 4A and FIG. 4B) is higher than a resistance value of a resistance Rb (see FIG. 4A and FIG. 4B) and hence, a change in potential of a drain electrode at the time of turning off a switch can be attenuated. Accordingly, it is possible to suppress ringing which occurs at the time of turning off a switch and, along with the suppression of occurrence of ringing, it is possible to lower a surge voltage generated at the time of turning off a switch. Further, a resistance value in the low resistance region 130b (see FIG. 4A and FIG. 4B) is lower than a resistance value in the high resistance regions 130a and hence, a difference in potential of the shield electrode 130 generated along a line of the shield electrode can be lowered whereby an erroneous operation (self turn-on) generated due to rising of a gate voltage $V_{GS}$ in the latter half of a switching period can be suppressed. Further, due to the presence of the low resistance region 130b, a switching speed can be increased and hence, the increase of a switching loss can be prevented.

Further, the semiconductor device 102 according to the embodiment 3 includes, as the shield electrode 130 thereof, the shield electrode where the high resistance regions 130a and the low resistance region 130b are disposed at positions spaced apart from each other with the electric insulating region 128 interposed therebetween and hence, the high resistance regions 130a are minimally influenced by the low resistance region 130b. Accordingly, a change in potential of the drain electrode can be further attenuated at the time of turning off a switch and hence, ringing which occurs at the time of turning off a switch can be further suppressed and, along with the suppression of occurrence of ringing, a surge voltage which occurs at the time of turning off a switch can be further reduced.

Although the present invention has been described based on the above-mentioned embodiments heretofore, the present invention is not limited to the above-mentioned embodiments. The present invention can be carried out in various modes without departing from the gist of the present invention, and the following modifications also are conceivable, for example.

(1) In the above-mentioned embodiment 1, for forming the high resistance regions 130a, for example, high resistance polysilicon which is formed by a CVD method is used and, for forming the low resistance region 130b, for example, low resistance polysilicon which is formed by a CVD method is used. However, the present invention is not limited to these materials. Materials other than these materials may be used.

(2) In the above-mentioned embodiment 2, for forming the high resistance regions 130a, for example, high resistance polysilicon which is formed by a CVD method is used and, for forming the low resistance region 130b, metal having a high-melting point (for example, W, Mo, Ta, Nb or the like) or other metals (for example, Cu or the like) is used. However, the present invention is not limited to these materials. Materials other than these materials may be used.

Figure 11A:
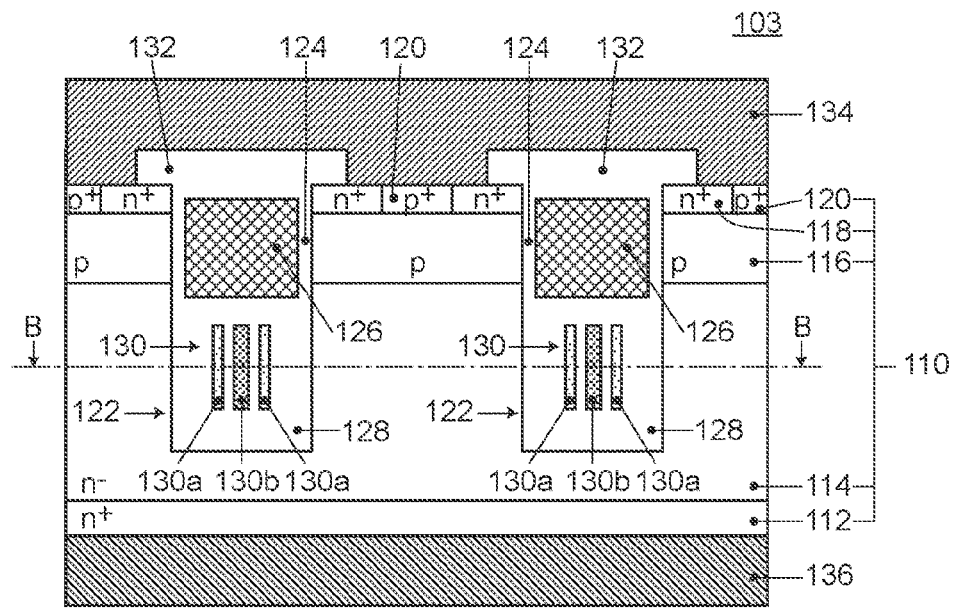
Figure 11B:
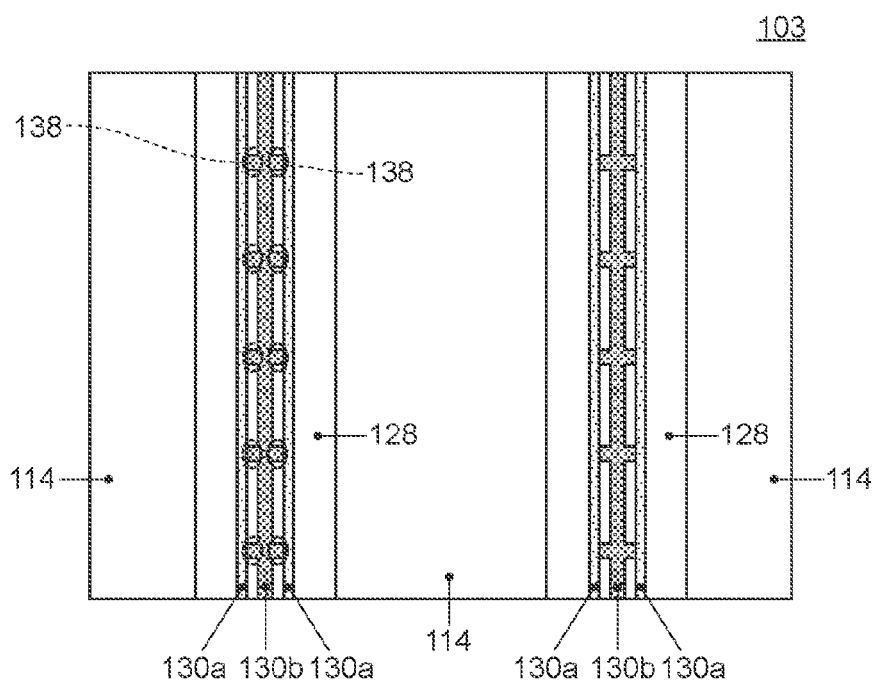
Figure 12:
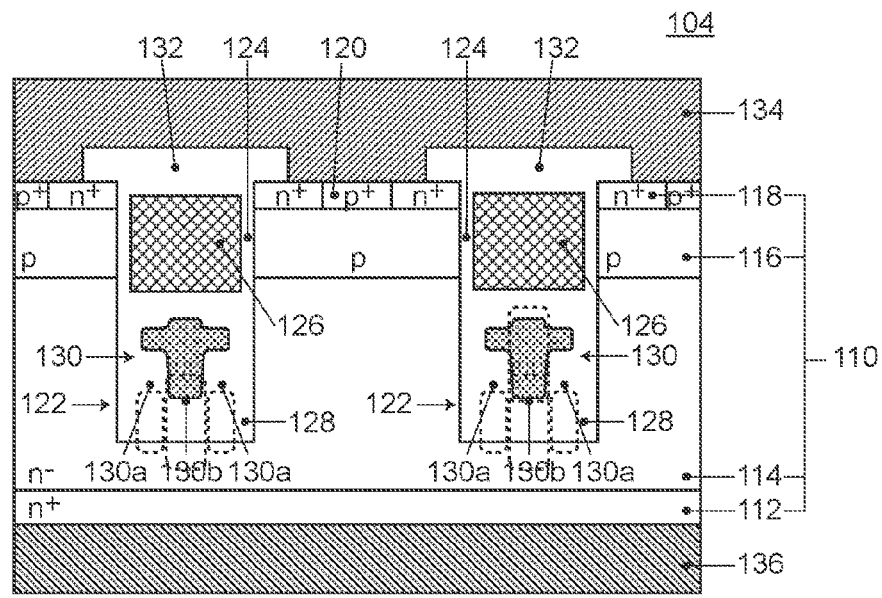
FIG. 12 is a cross-sectional view of a semiconductor device 104 according to a modification 2.
Figure 13:
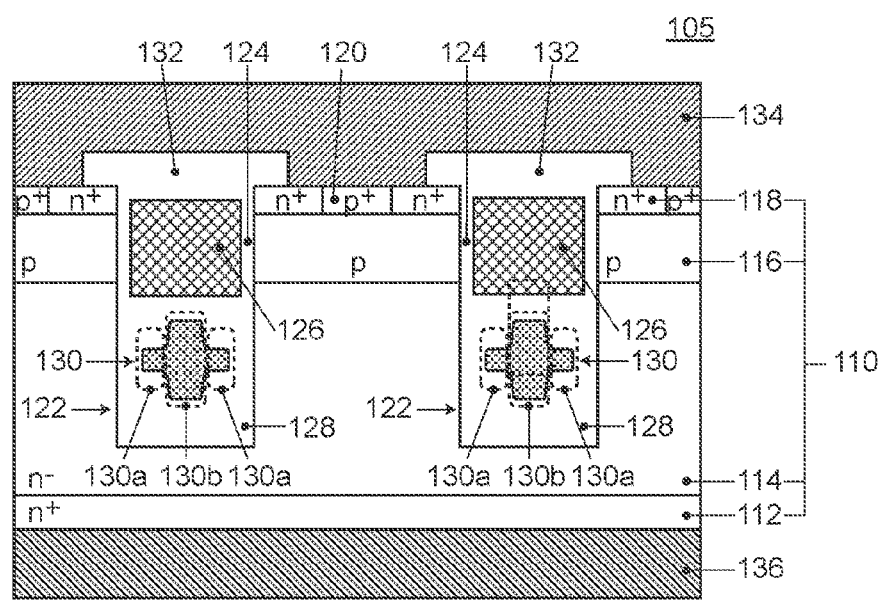
FIG. 13 is a cross-sectional view of a semiconductor device 105 different from the semiconductor device 104 according to the modification 2.
Figure 14:
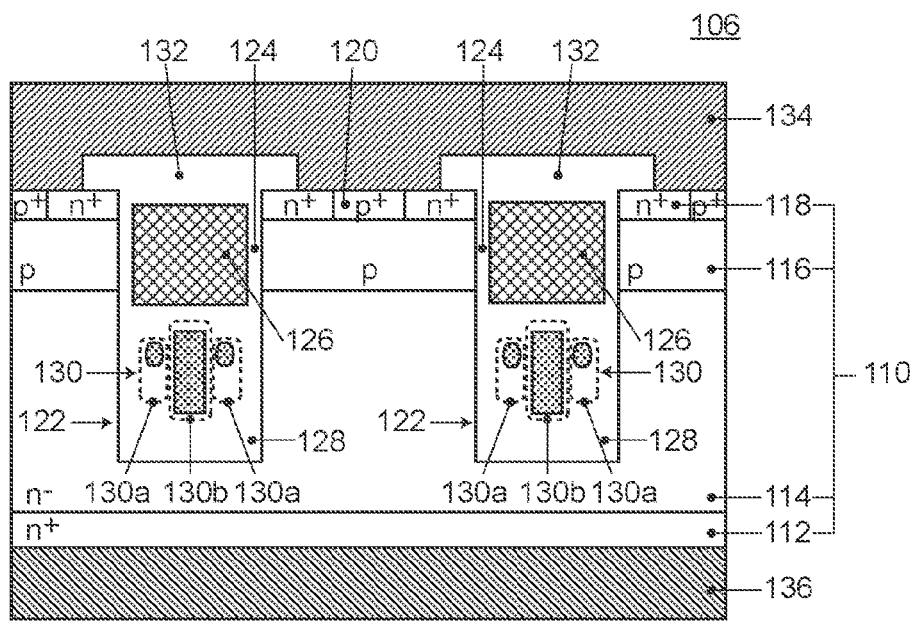
FIG. 14 is a cross-sectional view of a semiconductor device 106 according to a modification 3.
Figure 15:
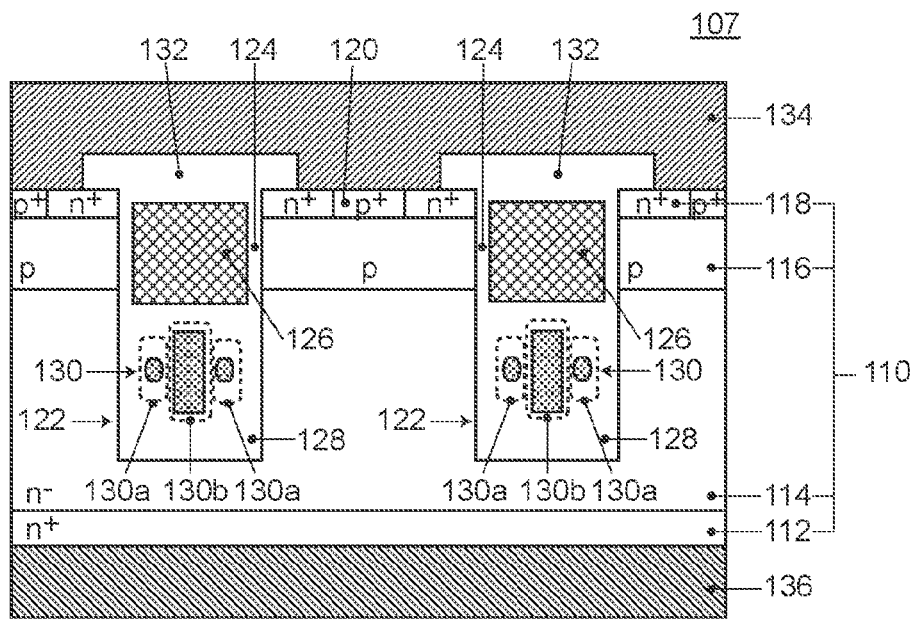
FIG. 15 is a cross-sectional view of a semiconductor device 107 different from the semiconductor device 106 according to the modification 3.

(3) In the above-mentioned embodiment 3, as a shield electrode, the shield electrode 130 is used where the high resistance region 130a and the low resistance region 130b are disposed at positions spaced apart from each other with the electric insulating region 128 interposed therebetween. In addition to such configuration, as shown in FIG. 11B, the electric insulating regions 128 sandwiched between the high resistance regions 130a and the low resistance region 130b have opening portions 138 partially in the electric insulating regions 128 and, as a shield electrode, the shield electrode may be used where the high resistance regions 130a and the low resistance region 130b are brought into contact with each other partially through the opening portions 138 (modification 1).

(4) In the above-mentioned embodiment 1, as a shield electrode, the shield electrode is used where both the high resistance regions 130a and the low resistance region 130b are made of the same semiconductor material containing a dopant, and where dopant concentration in the low resistance region 130b is higher than dopant concentration in the high resistance regions 130a. In the above-mentioned embodiment 2, as a shield electrode, the shield electrode is used where the high resistance regions 130a and the low resistance region 130b are made of different materials respectively, and electric resistivity of the material for forming the low resistance region 130b is lower than electric resistivity of the material for forming the high resistance regions 130a. However, the present invention is not limited to such a shield electrode. For example, as shown in FIG. 12 to FIG. 15, shield electrodes may be used where both the high resistance regions 130a and the low resistance region 130b are made of the same material, and a cross-sectional area of the low resistance region 130b taken along a plane orthogonal to a stripe longitudinal direction of the shield electrode 130 (a longitudinal direction of the shield electrode substantially parallel to a longitudinal direction of a trench which forms a stripe pattern) is larger than a cross-sectional area of the high resistance region 130a taken along the same plane (modification and modification 3 (see FIG. 12 to FIG. 15)). The modification 2 (FIG. 12 and FIG. 13) is an example where a semiconductor material containing a dopant which forms high resistance regions 130a and a semiconductor material containing a dopant which forms a low resistance region 130b are formed continuously. On the other hand, the modification 3 (FIG. 14 and FIG. 15) is an example where a semiconductor material containing a dopant which forms high resistance regions 130a and a semiconductor material containing a dopant which forms a low resistance region 130b are formed separately from each other.

Also with such a configuration, the semiconductor device includes the shield electrode having the high resistance regions (high resistance regions 130a) positioned on a drain region 112 side and the low resistance region (low resistance region 130b) positioned on a gate electrode 126 side and hence, the semiconductor device acquires advantageous effects which the semiconductor device 100 according to the embodiment 1 possesses. In this case, the shield electrode 130 may have various cross-sectional shape such as an inversed triangular shape, an inversed pentagonal shape, a baseball home plate shape or a pushpin shape, and a shape obtained by developing these shapes in left-and-right symmetry with respect to a center line which passes the center of the gate electrode.

(5) In the above-mentioned embodiment 1, the description has been made with respect to the case where the semiconductor device 100 is a power MOSFET. However, the present invention is not limited to such a case. The present invention is applicable to various other devices besides the power MOSFET without departing from the gist of the present invention.

Figure 16:
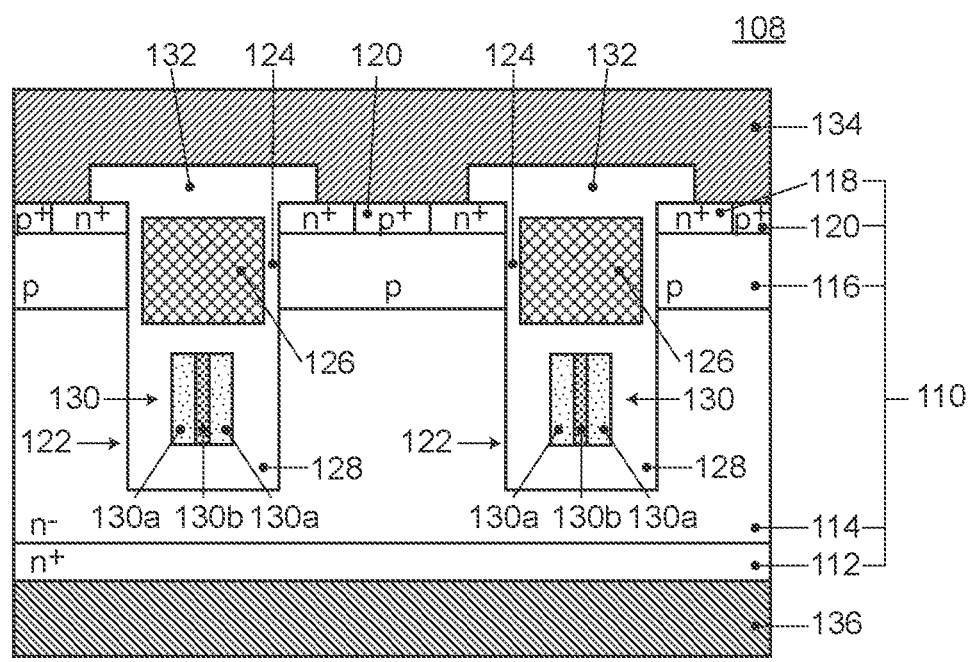
FIG. 16 is a cross-sectional view of a semiconductor device 108 according to a modification 4.
Figure 17A:
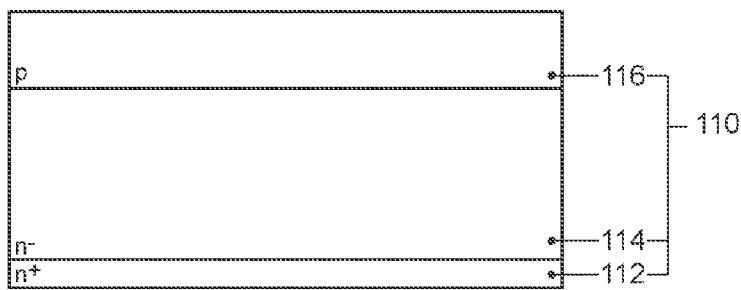
Figure 17B:
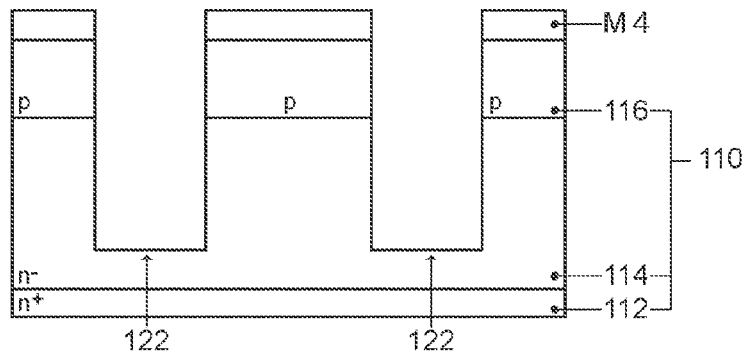
Figure 17C:
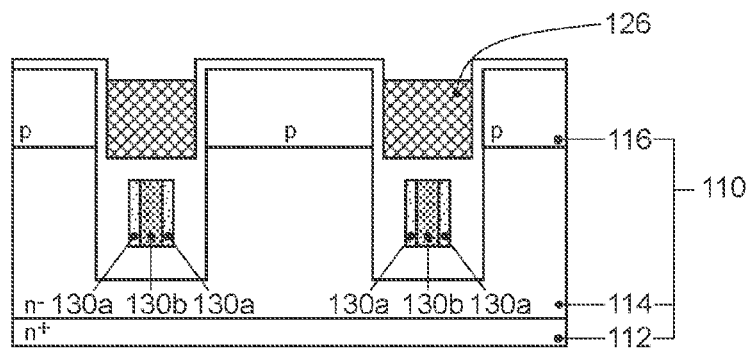
Figure 17D:
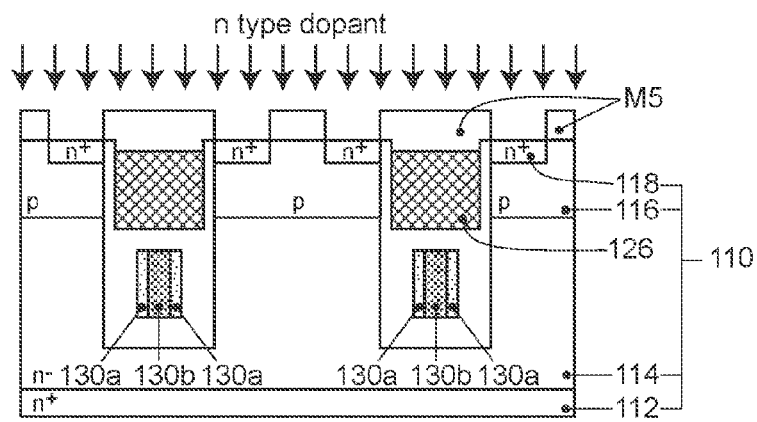
Figure 18A:
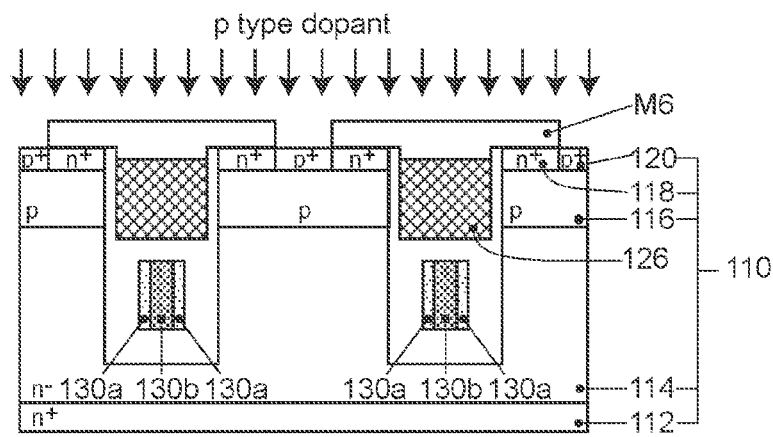
Figure 18B:
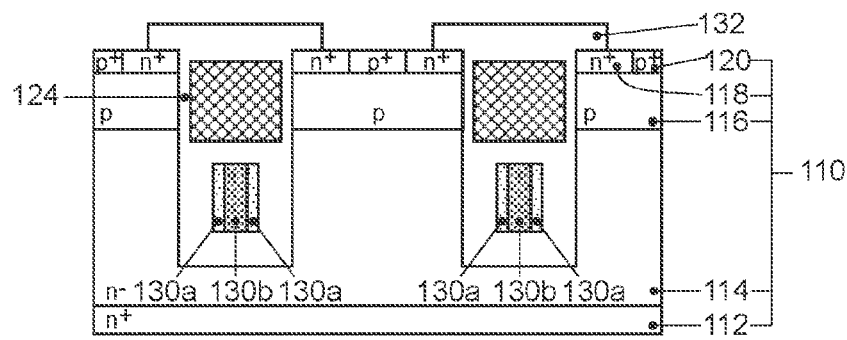
Figure 18C:
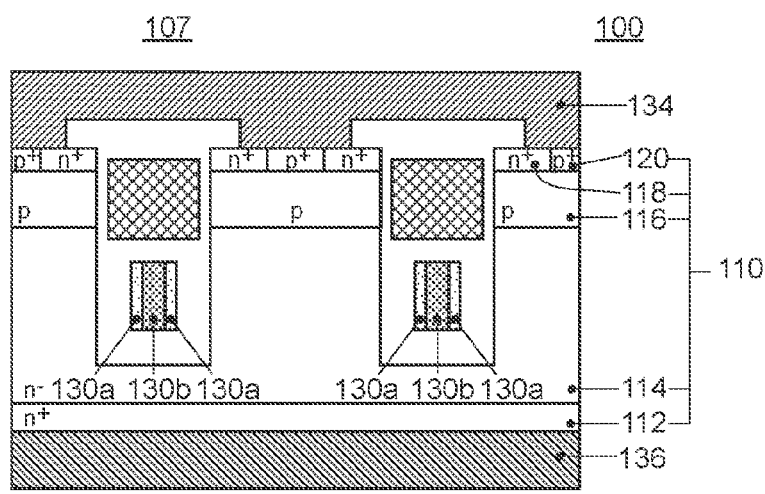
Figure 19A:
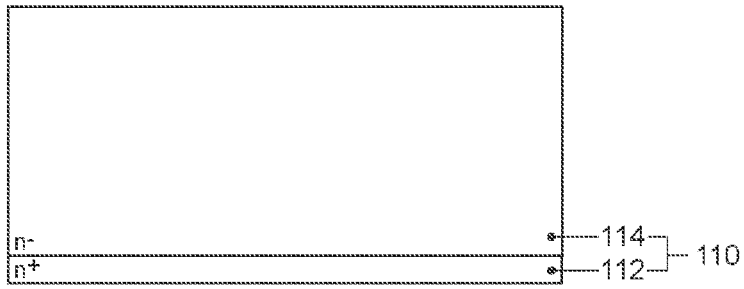
Figure 19B:
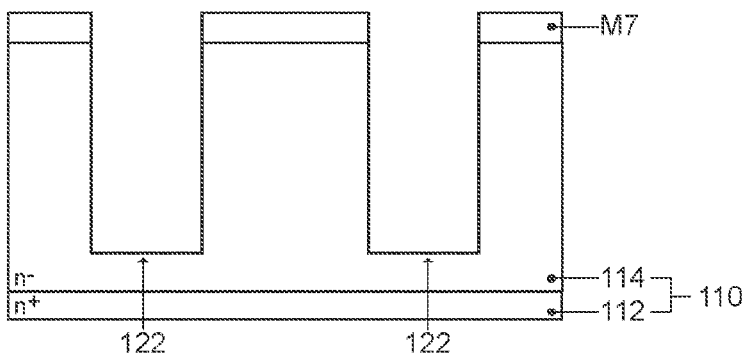
Figure 19C:
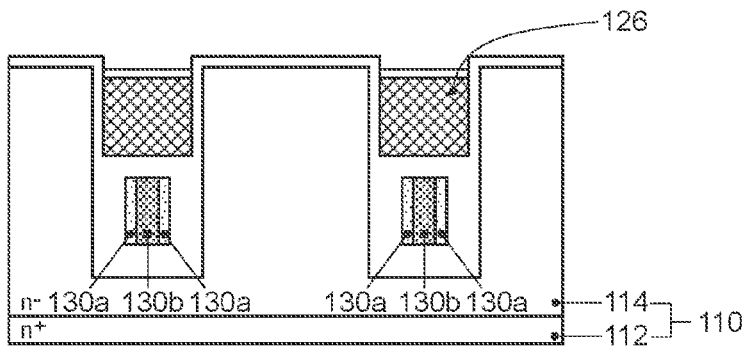
Figure 19D:
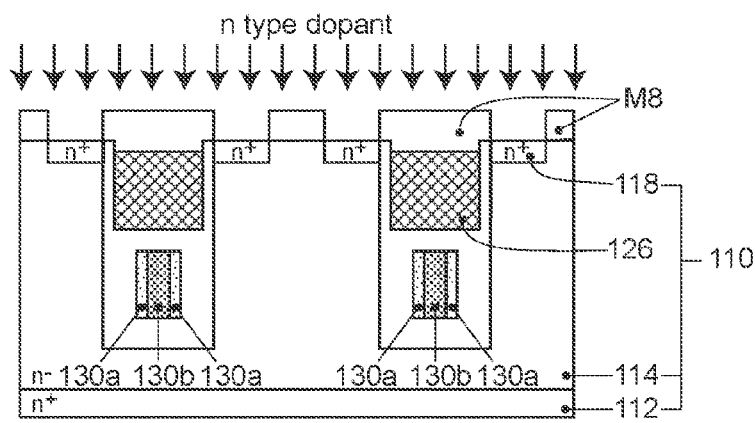
Figure 20A:
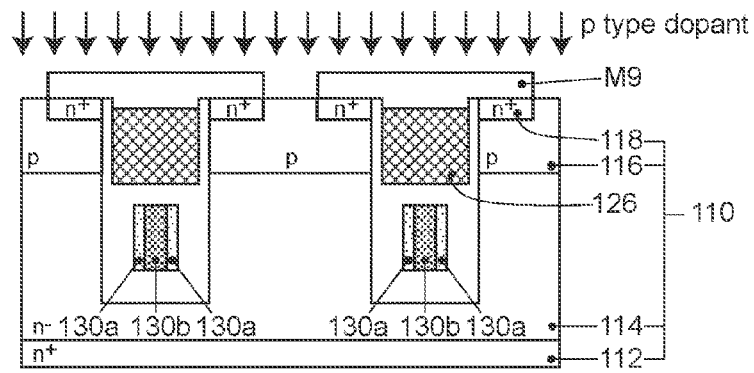
Figure 20B:
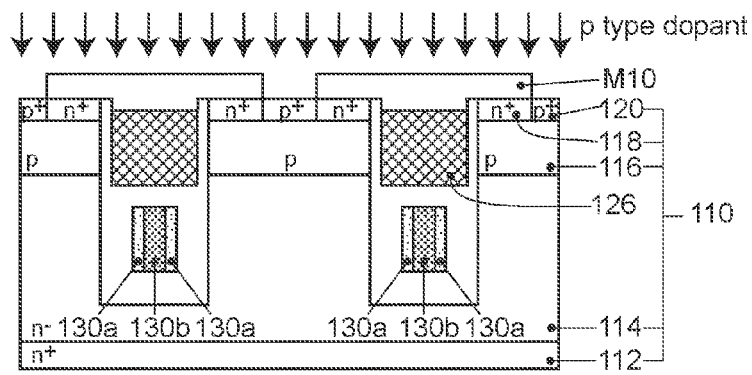
Figure 20C:
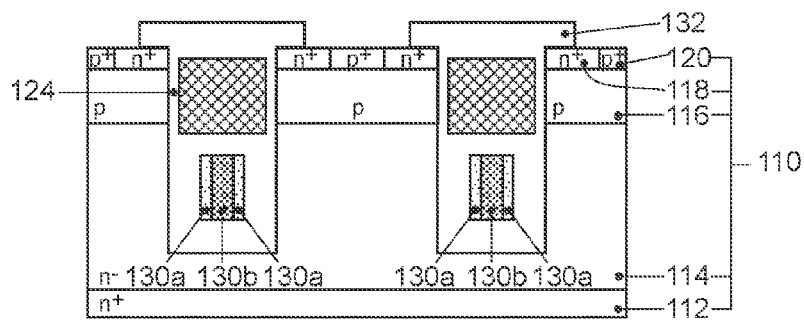
Figure 20D:
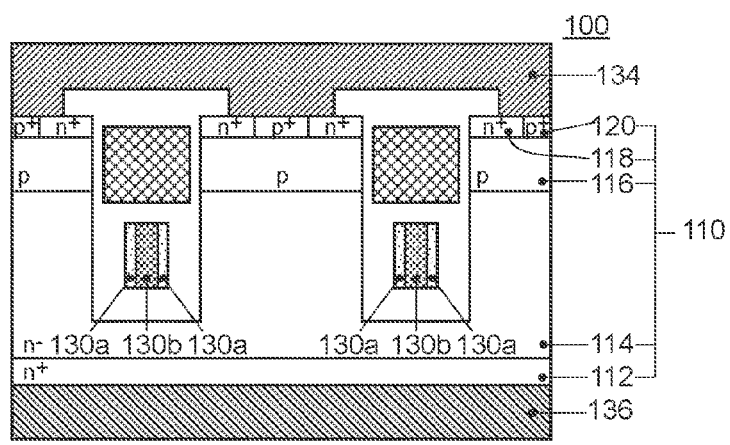
Figure 21A:
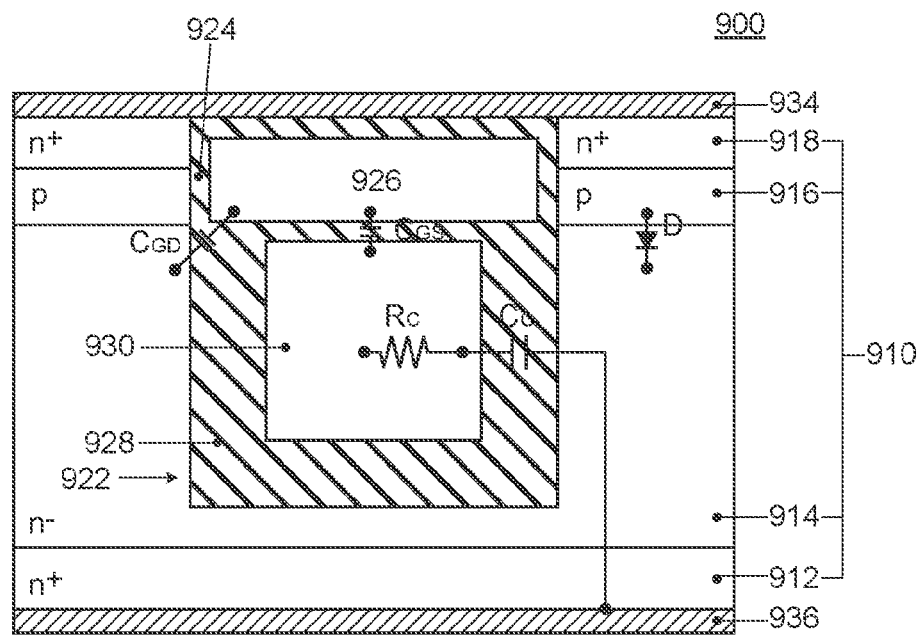
Figure 21B:
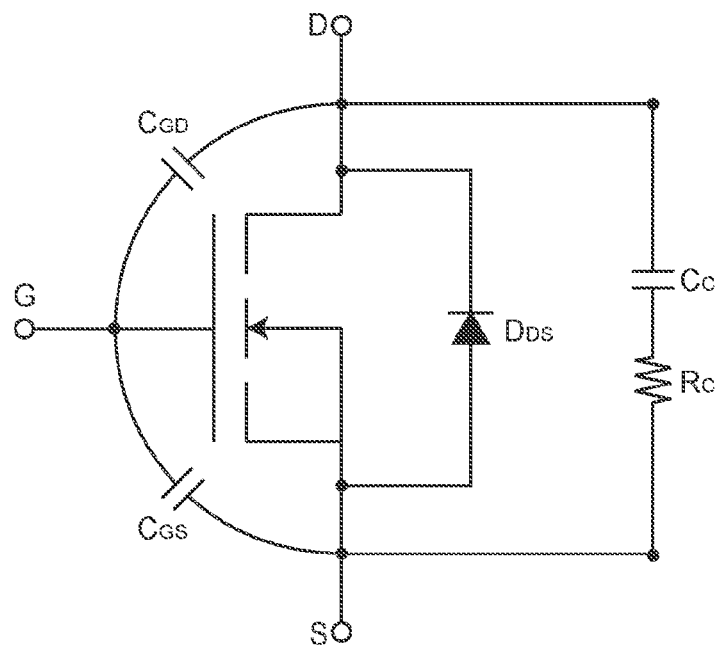

(6) In the above-mentioned embodiment 1, the example is described where a thickness of the high resistance region 130a is set smaller than a thickness of the low resistance region 130b (see FIG. 1A). However, the present invention is not limited to such a case. The thickness of the low resistance region 130b may be set smaller than the thickness of the high resistance region 130a (modification 4, see FIG. 16)), or the thickness of the low resistance region 130b and the thickness of the high resistance region 130a may be set substantially equal to each other.

The semiconductor device of the modification 4 can increase an effect of reducing ringing which occurs at the time of turning off a switch or a surge voltage generated at the time of turning off a switch. The semiconductor device of the embodiment 1 can increase an effect of preventing the increase of an erroneous operation (self turn-on) due to rising of a gate voltage $V_{GS}$ in the latter half of a switching period and a switching loss which occur.

(7) The semiconductor device 100 according to the embodiment 1 can be manufactured also by a method different from the method described in the embodiment 1. For example, as shown in FIG. 17A to FIG. 18C, a shield electrode 130 and a gate electrode 126 are formed and, thereafter, an $n^+$ type source region 118 and a $p^+$ type contact region 120 may be formed. Further, for example, as shown in FIG. 19A to FIG. 20D, a shield electrode 130 and a gate electrode 126 are formed and, thereafter, an $n^+$ type source region 118, a p type base region 116 and a $p^+$ type contact region 120 may be formed.

The invention claimed is:

1. A semiconductor device comprising:
   a semiconductor base body having a drain region of a first conductive type, a drift region of the first conductive type disposed adjacently to the drain region, a base region of a second conductive type disposed adjacently to the drift region, and a source region of the first conductive type disposed adjacently to the base region, and having a trench in the inside of there, the trench having a bottom disposed adjacently to the drift region and a side wall disposed adjacently to the base region and the drift region, the trench being formed into a stripe pattern as viewed in a plan view;
   a gate electrode disposed in the inside of the trench and opposedly facing the base region with a gate insulating film interposed therebetween on a portion of the side wall;
   a shield electrode disposed in the inside of the trench and positioned between the gate electrode and the bottom of the trench;
   an electric insulating region disposed in the inside of the trench, the electric insulating region expanding between the gate electrode and the shield electrode, and further expanding along the side wall and the bottom of the trench so as to separate the shield electrode from the side wall and the bottom;

a source electrode formed above the semiconductor base body and electrically connected to the source region and the shield electrode; and a drain electrode formed adjacently to the drain region, wherein the shield electrode has high resistance regions formed at positions where the high resistance regions opposedly face the side walls, and a low resistance region formed at a position where the low resistance region is sandwiched between the high resistance regions.

2. The semiconductor device according to claim 1, wherein both the high resistance regions and the low resistance region are made of a same semiconductor material containing a dopant, and dopant concentration in the low resistance region is higher than dopant concentration in the high resistance regions.

3. The semiconductor device according to claim 1, wherein the high resistance regions and the low resistance region are made of different materials respectively, and electric resistivity of the material for forming the low resistance region is lower than electric resistivity of the material for forming the high resistance regions.

4. The semiconductor device according to claim 1, wherein both the high resistance regions and the low resistance region are made of a same material, and a cross-sectional area of the low resistance region taken along a plane orthogonal to a stripe longitudinal direction of the shield electrode is larger than a cross-sectional area of the high resistance region taken along a plane orthogonal to the stripe longitudinal direction of the shield electrode.

5. The semiconductor device according to claim 1, wherein the high resistance regions and the low resistance region are disposed at a position where the high resistance regions and the low resistance region are brought into contact with each other.

6. The semiconductor device according to claim 1, wherein the high resistance regions and the low resistance region are disposed at positions spaced apart from each other with the electric insulating region interposed therebetween.

7. The semiconductor device according to claim 6, wherein in the electric insulating region, the electric insulating regions sandwiched between the high resistance regions and the low resistance region have opening portions partially, and the high resistance regions and the low resistance region are brought into contact with each other partially through the opening portions.

8. The semiconductor device according to claim 2, wherein a thickness of the low resistance region is thinner than a thickness of the high resistance region.

9. The semiconductor device according to claim 2, wherein a thickness of the high resistance region is thinner than a thickness of the low resistance region.

* * * * *